(12) United States Patent
Cheringal et al.

(10) Patent No.: US 12,215,531 B1
(45) Date of Patent: Feb. 4, 2025

(54) CONTROL SYSTEM FOR VEHICLE DOORS

(71) Applicant: Zoox, Inc., Foster City, CA (US)

(72) Inventors: William Cheringal, San Francisco, CA (US); Evan David Cook, Woodside, CA (US); Nigil Lee, San Francisco, CA (US)

(73) Assignee: Zoox, Inc., Foster City, CA (US)

( * ) Notice: Subject to any disclaimer, the term of this patent is extended or adjusted under 35 U.S.C. 154(b) by 917 days.

(21) Appl. No.: 17/125,580

(22) Filed: Dec. 17, 2020

(51) Int. Cl.
| | |
|---|---|
| *E05F 15/40* | (2015.01) |
| *B60J 5/04* | (2006.01) |
| *B60J 5/06* | (2006.01) |
| *E05F 15/659* | (2015.01) |
| *E05F 15/70* | (2015.01) |
| *G01R 19/165* | (2006.01) |
| *H02P 5/74* | (2006.01) |
| *H02P 23/14* | (2006.01) |
| *H02P 23/24* | (2016.01) |

(52) U.S. Cl.
CPC ............ *E05F 15/40* (2015.01); *B60J 5/0413* (2013.01); *B60J 5/0469* (2013.01); *B60J 5/0479* (2013.01); *B60J 5/06* (2013.01); *E05F 15/659* (2015.01); *E05F 15/70* (2015.01); *G01R 19/16571* (2013.01); *H02P 5/74* (2013.01); *H02P 23/14* (2013.01); *H02P 23/24* (2016.02); *E05Y 2201/434* (2013.01); *E05Y 2400/44* (2013.01); *E05Y 2400/54* (2013.01); *E05Y 2900/531* (2013.01); *H02P 2205/01* (2013.01)

(58) Field of Classification Search
CPC ......... E05F 15/40; E05F 15/659; E05F 15/70; H02P 23/24; H02P 5/74; H02P 23/14; H02P 2205/01; B60J 5/0413; B60J 5/0469; B60J 5/0479; B60J 5/06; G01R 19/16571; E05Y 2201/434; E05Y 2400/44; E05Y 2400/54; E05Y 2900/531
See application file for complete search history.

(56) References Cited

U.S. PATENT DOCUMENTS

| | | | | |
|---|---|---|---|---|
| 2007/0294001 | A1* | 12/2007 | Underdal | G06N 7/01 701/31.4 |
| 2010/0242363 | A1* | 9/2010 | Hirota | E05F 15/41 318/473 |
| 2020/0291705 | A1* | 9/2020 | Takenaka | H02P 7/00 |
| 2020/0386035 | A1* | 12/2020 | Battlogg | B60R 21/013 |
| 2022/0290481 | A1* | 9/2022 | Kromer | E05F 15/611 |
| 2023/0243199 | A1* | 8/2023 | Semineth | E05F 15/40 49/28 |
| 2024/0208372 | A1* | 6/2024 | Herrmann | B60N 2/0278 |

* cited by examiner

*Primary Examiner* — Jess Whittington
*Assistant Examiner* — Rami Nabih Bedewi
(74) *Attorney, Agent, or Firm* — Lee & Hayes, P.C.

(57) ABSTRACT

Techniques for controlling a vehicle based on a collision avoidance algorithm are discussed herein. The vehicle receives sensor data and can determine that the sensor data represents an object in an environment through which the vehicle is travelling. A computing device associated with the vehicle determines a collision probability between the vehicle and the object at predicted locations of the vehicle and object at a first time. Updated locations of the vehicle and object can be determined, and a second collision probability can be determined. The vehicle is controlled based at least in part on the collision probabilities.

20 Claims, 8 Drawing Sheets

CONTROL SYSTEM FOR VEHICLE DOORS

BACKGROUND

Various methods, apparatuses, and systems are utilized by vehicles to control doors of the vehicles. In some examples, motors can be operated to control movement of the doors. In the event of an obstruction while the doors are closing, the doors may open. However, existing techniques do not take into account changing conditions of the vehicle.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
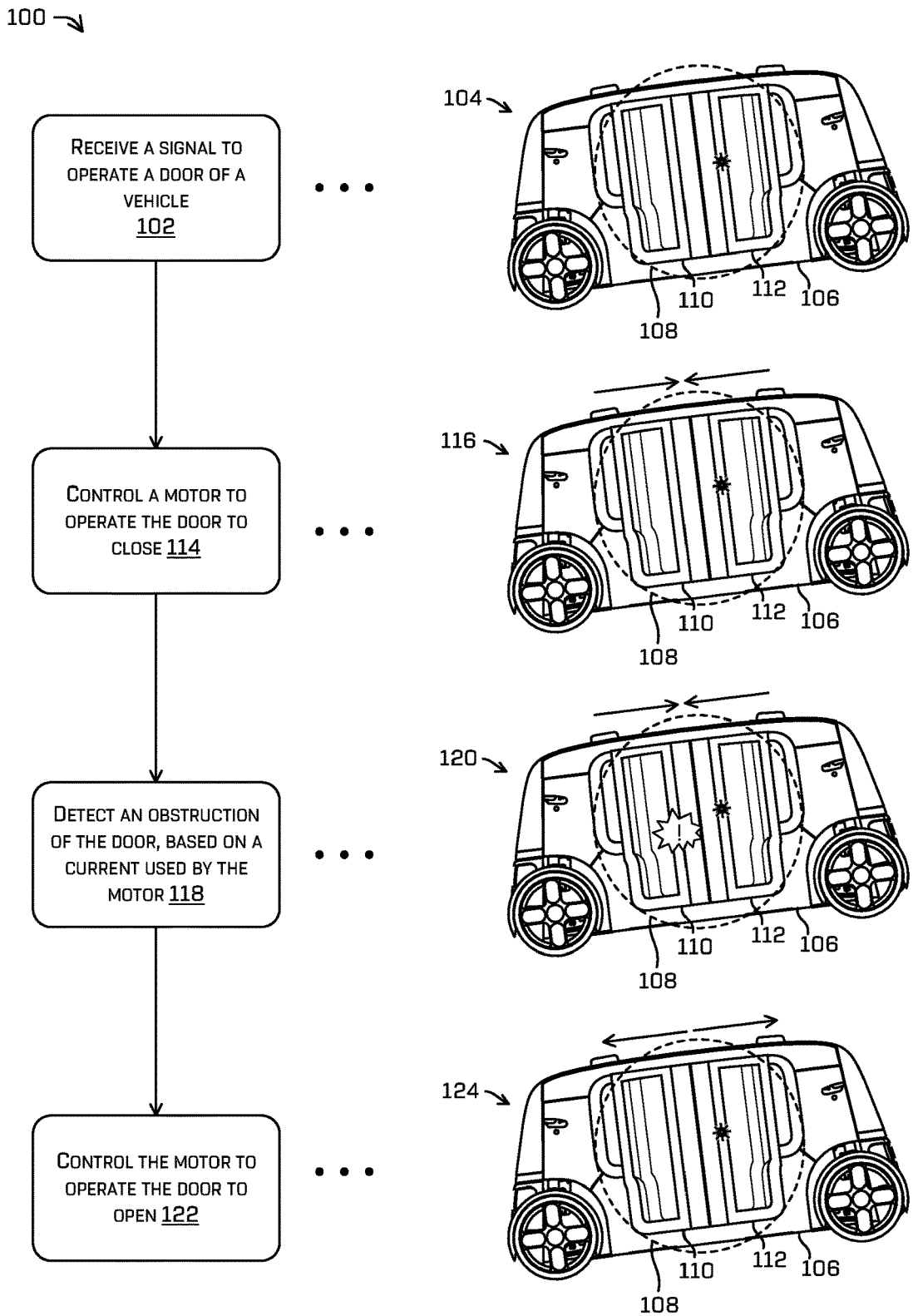
FIG. 1 is a pictorial flow diagram of an example process of controlling a door of a vehicle to close based on a pitch or a roll of the vehicle, in accordance with examples of the disclosure.

As discussed above, existing techniques do not take into account changing conditions when controlling operation of doors of the vehicle. Existing vehicle doors typically operate in substantially a same manner regardless of the conditions associated with the vehicle, which can result in injury or damage to persons or objects in or near the path of movement of the doors of the vehicle.

This application relates to controlling doors of a vehicle based at least in part on a condition (e.g., pose, pitch, roll, temperature, supplied voltage, etc.) associated with the vehicle. For example, the vehicle can operate a door based on a signal to open or close the door. One or more conditions associated with the vehicle can be determined. In some examples, the one or more conditions may include a pitch and/or roll of the vehicle. The condition(s) associated with the vehicle may affect how much force is required to open or close the door of the vehicle or how efficient a drive system for the door will operate. For instance, if the vehicle is on an incline (e.g., the pose of the vehicle includes a pitch or roll), gravity may act on the door to increase or decrease a force needed to open or close the door. An expected current needed for an electric motor to operate the door can be determined based on the condition(s) associated with the vehicle. The motor may then be actuated to open or close the door, and an actual current used by the motor to operate the door can be measured (e.g., by a current sensor) during operation of the door. The actual current can be compared to the expected current during operation of the door and if the actual current exceeds the expected current by a threshold amount, an obstruction in the door can be detected. For instance, if the signal is a signal to close the door, the obstruction may correspond to a pinch event in which an object (e.g., person, appendage, bag, etc.) is preventing the door from closing. If the signal is a signal to open the door, the obstruction may correspond to a blocking event in which an object is preventing the door from opening. Because the determination of the expected current takes into account one or more conditions of the vehicle at the time the signal is received to operate the door, the vehicle is able to detect an obstruction (e.g., pinch event or blocking event) quickly, accurately, and with less variation. Consequently, the techniques described herein allow the vehicle to detect an obstruction of a door in response to a more accurate force than existing door operation systems. As stated herein, if a blockage is not detected and a door system closes, an occupant may be injured based on a pinched finger, caught purse or article of clothing, etc. and the blockage not being detected may represent a safety hazard. If blockages are overly detected, then a door system may fail to operate reliability and react to falsely detected blockages which may result in wasted power and time. Upon detecting the obstruction, the vehicle can perform a mitigating action to prevent damage or injury to the object causing the obstruction. The action can include controlling the motor to operate the door differently, such as to cease operating or to operate the door in a different direction.

The techniques discussed herein can improve the safety and performance of a door operation system. For instance, the techniques discussed herein may improve a speed, accuracy, and consistency with which a door operation system is able to detect an obstruction over a wide range of operating conditions. Additionally, in some examples, the door operation system may detect an obstruction sooner and based on a smaller force than was previously possible, thereby preventing damage or injury to the object causing the obstruction. Although condition(s) are described above as being associated with the vehicle, the condition(s) may additionally or alternatively be associated with a component or portion of a vehicle such as, for example, a portion of a vehicle (e.g., a door, window, sunroof, hatch or other panel, a segment or area of a body, a sun shade, etc.). For example, as discussed throughout, a panel can be a door, a window, a sunroof, a sub-panel or portion of any of the foregoing, etc.

In some examples, the condition(s) can include a physical state of the vehicle. For example, the physical state can include a pose, a pitch, a roll, a temperature, a voltage, an age, or other measurable condition associated with the vehicle and/or a portion of the vehicle (e.g., a portion on which sun is shining, a shaded portion of the vehicle on which sun is not shining, an age of the vehicle or a component of the vehicle, etc.).

The techniques described herein can be implemented in a number of ways. Example implementations are provided below with reference to the following figures. Although examples are described in which double doors are provided on both sides of a vehicle, the techniques described herein are applicable to single doors which may be present on any one or more sides of a vehicle. Also, while discussed in the context of a vehicle, such as an automobile, the methods, apparatuses, and systems described herein can be applied to other types of vehicles (e.g., busses, trucks, trains, watercraft, aircraft, etc.), as well as to a variety of other systems. The techniques are not limited to vehicles and can be utilized in connection with a building door operation system or in any other system that includes a motor operated door that experiences varying conditions.

FIG. 1 is a pictorial flow diagram of an example process 100 of controlling a door of a vehicle based on a condition (e.g., a pitch and/or a roll) of the vehicle, in accordance with examples of the disclosure.

At operation 102, the process can include receiving a signal to operate a door of a vehicle. In some examples, the vehicle can include one or more doors, such as a door on each side of the vehicle. The door can include one or more sub-panels (e.g., two sub-panels that open in opposite directions) that are operable to open or close by one or more motors. One or more conditions of the vehicle can be determined that affect a force required to operate one or more panel(s) (e.g., doors, windows, sunroofs, or sub-panels of any of the foregoing) of the vehicle. By way of example and not limitation, the conditions may include a pose (e.g., pitch and/or roll) of the vehicle, a temperature (e.g., ambient temperature or temperature of a motor used to operate the door(s)), a voltage supplied to the a motor used to operate the door(s), and/or a historical current required by a motor to operate the door(s). An amount of a pitch and/or a roll the vehicle may be indicative of a grade on which the vehicle is parked. The amount of pitch and/or roll may affect the force required to open or close the door(s) due to gravity acting on the doors by providing a gravity force upon the door mechanism in a different vector depending on the pose of the vehicle. The temperature (ambient temperature or temperature of a motor) and voltage may both affect a current required by the motor to operate the door(s). The historical current required by a motor to operate the door(s) may change over time due to wear of the motor, hinges, linkages, door seals, or the like. Any or all of these conditions may be measured in order to determine an accurate estimate of current for the motor to operate the door(s).

In examples in which the condition(s) include a pitch and/or roll of the vehicle, one or more sensors (e.g., inertial measurement units, accelerometers, gyroscopes, and/or magnetometer) associated with the vehicle can sense the amount of the pitch and/or the roll of the vehicle. The amount of the pitch and/or the roll may be greater or less than zero. The amount of the pitch being greater or less than zero can be associated with a first longitudinal end portion of the vehicle being lower or higher than a second longitudinal end portion of the vehicle. The amount of the roll being greater or less than zero can be associated with a first lateral side (e.g., a left portion) of the vehicle being lower or higher than a second lateral side (e.g., a right portion) of the vehicle. Some vehicles may be segmented (e.g., a segmented bus) in which various segments of a vehicle can independently have a different pose with respect to an underlying surface. The techniques disclosed herein can be used to detect the pose for each of a plurality of vehicle segments and/or door modules that can each independently be controlled based on the condition of segment or module. For example, multiple door modules may have a similar pose but may have differing environmental or electrical characteristics (e.g., may operate at different instantaneous temperatures and/or be provided with different voltage levels).

In some examples, receiving the signal can include receiving a signal to operate, together or separately, more than one door or panel of the vehicle. Additionally or alternatively, receiving the signal can include receiving multiples signals to operate, together or separately, different respective doors or panels. The signal(s) can include a signal to operate a door to open, a signal to operate a door to close, or a signal to operate a door to a specified position or in a specified direction. Multiple signals can be received at the same time or at different times.

The signal to operate the door can be received from a local device, such as a controller or computing device associated with the vehicle. The local device can be mounted on, or integrated within, the vehicle. The signal(s) can be generated by the local device in response to a triggering event, such as the vehicle arriving at a destination location, a passenger being within threshold proximity of the vehicle, a user input from an occupant inside or outside the vehicle, a user input to a mobile device, or the like. In some examples, the vehicle can include a user interface that receives an input from the user (e.g., a touch input, a gesture input, a voice input, a signal from a device of the user, etc.). In some examples, the vehicle device can include a sensor (e.g., a proximity sensor (e.g., a passive infrared sensor), a camera, or the like) that senses a passenger in an area within a proximity of the door (e.g., a sensor that senses a passenger within a distance from the proximity sensor, the distance being greater than or less than a threshold distance). The signal can be generated by the vehicle device based on the touch being sensed by the user interface or based on the passenger being sensed by the sensor.

In some examples, the signal to operate the door can be received from a remote device, such as a device associated with a passenger or a remote operator. The device (e.g., passenger device) associated with the passenger can include a mobile device (e.g., a smartphone). The device associated with the remote operator can include a teleoperator device (e.g., a computing device used by a remote operator to monitor and/or control operation of the vehicle or a fleet of vehicles). The remote device can include a user interface that receives an input request to control operation of one or more doors of the vehicle. The remote device can include an image processing device configured analyze an image of an area associated with the vehicle (e.g., an area inside and/or outside the vehicle), the image being captured by a camera of the vehicle. The image processing device can determine a location of the passenger based on the image. The signal can be generated by the image processing device based on the location associated with the passenger relative to an inside or outside of a door of the vehicle. The passenger device can include a sensor that senses a location of the passenger device. The signal can be generated by the passenger device based on the location associated with the passenger device being sensed to be less than or greater than a threshold distance of the inside or outside of the door of the vehicle. In some examples, the passenger device can be sensed as being inside or outside the door of the vehicle based on determining whether a GPS location of the passenger device is associated with a position of the passenger device being inside or outside of the vehicle, whether the passenger device is or is not communicatively coupled to the vehicle by one or more networks (e.g., a Bluetooth network, a Wi-Fi network, etc.), whether an identification (e.g., an RFID tag) associated with the passenger device is sensed, etc. For example, by determining the passenger device is not communicatively coupled to the vehicle by the one or more networks, the signal can be generated to operate the door to close. Although various techniques to operate the door as discussed above can be utilized separately, implementation of the techniques is not limited as such. Operation of the door can be based on any combination of one or more of the above described techniques.

An example 104 illustrates a vehicle 106 in which a signal is utilized to operate a door 108 of the vehicle 106. The vehicle 106 can include the door 108 on one side (e.g., left side) of the vehicle 106 and/or a door on another side (e.g., right side) of the vehicle 106. The door 108 can include a sub-panel 110 and a sub-panel 112. One or more conditions of the vehicle can be determined that affect a force required to operate the door 108. By way of example and not limitation, the conditions may include a pose (e.g., pitch and/or roll) of the vehicle, a temperature (e.g., ambient temperature or temperature of a motor used to operate the door(s)), a voltage supplied to the a motor used to operate the door 108, and/or a historical current required by a motor to operate the door 108. An amount of the pitch and/or a roll the vehicle 106 can be greater or less than zero. The amount of the pitch being greater or less than zero can be associated with a first longitudinal end portion of the vehicle 106 being lower or higher than a second longitudinal end portion of the vehicle 106. The amount of the roll being greater or less than zero can be associated with a left portion of the vehicle 106 being lower or higher than a right portion of the vehicle 106. In general, a pitch of the vehicle can have a greater impact than a roll of the vehicle, on a current used by the motor to operate the door. The signal to operate the door 108 can be received from a local device or a remote device. The signal to operate the door 108, which is closed, can be received to open the door 108.

At operation 114, the process can include controlling a motor to operate the door to open. In some examples, the motor can be controlled to operate the door based on the signal that is received by the vehicle. The motor can be controlled to operate a sub-panel of the door based on a current (e.g., expected current), which can vary based on the condition(s). The current can vary at different points along the path of the door. The current used by the motor controlled to operate the sub-panel can be different than a current used by a motor controlled to operate a different sub-panel (e.g., adjacent sub-panel). The current associated with the sub-panel can be different (e.g., lower) than the current associated with the adjacent sub-panel, based on a force (e.g., gravitational force) associated with each sub-panel. For example, the current associated with the sub-panel can be based on a component of the force associated with the sub-panel being in a direction that is the same as a direction of movement of the sub-panel. The current associated with the adjacent sub-panel can be based on a component of the force associated with the adjacent sub-panel being in a direction that is the opposite to a direction of movement of the adjacent sub-panel. The force associated with each sub-panel can be associated with a torque that would be required to operate the motor used to control the sub-panel to stop and remain stopped.

In some examples, expected currents used to control the motors to operate the doors of the vehicle can be determined based on a data structure (e.g., a look-up table). The look-up table can include values of currents associated with characteristics of the motors of the vehicle. In some instances, a characteristic can include a value of a torque that would be required to operate the motor used to control the sub-panel to stop and remain stopped. The look-up table can be referenced (e.g., searched and/or queried) to determine the currents used to control the motors to operate the sub-panels (e.g., the sub-panel and the different sub-panel). The look-up table can be utilized to determine the currents, based on the torque that would be required to operate the motor used to control the sub-panels to stop and remain stopped. In some examples, an expected current can be determined based on a formula that can, for example, apply weighting(s) to one or more inputs (e.g., temperature, pose, etc.) thus determining the expected current in real time.

An example 116 illustrates the door 108 being controlled by the motor based on the signal that is received by the vehicle 106. The motor can be controlled to operate the door 108 based on a current (e.g. expected current), which can be determined based on the condition(s). The door 108 can include a sub-panel (e.g., sub-panel 110) that is operated based on the current. The current used by the motor to operate the sub-panel 110 can be different (e.g., lower) than a current used by a motor controlled to operate a different sub-panel (e.g., sub-panel 112) of the door 108. For example, the current used by the motor to operate the sub-panel 110 can be based on a component of a force (e.g., gravitational force) associated with the sub-panel 110. The component of the force associated with the sub-panel 110 can be in a direction that is the same as a direction of movement of the sub-panel 110. The current associated with the sub-panel 112 can be based on a component of the force associated with the sub-panel 112. The component of the force associated with the sub-panel 112 can be in a direction that is the opposite to a direction of movement of the sub-panel 112. The force associated with each sub-panel (e.g., the sub-panel 110 and the sub-panel 112) can be associated with a torque applied to respective hinges of the sub-panel. The current associated with the torque can be sensed and utilized to control the current. For example, the vehicle can included one or more sensors (e.g., current based sensors) to sense the current associated with the torque that would be required to operate the motor used to control the sub-panel 110 to stop and remain stopped. Each of the sensors can sense the current associated with the torque that would be required to operate the motor used to control the sub-panel 110 to stop and remain stopped. The current used by the motor to operate the sub-panel 110 can change based on the current that is sensed. The current used by the motor to operate the sub-panel 112 can change based on the torque that would be required to operate the motor used to control the sub-panel 112 to stop and remain stopped.

In some examples, the current (e.g., expected current) used to control the motor to operate the door 108 can be determined based on a data structure (e.g., a look-up table). The look-up table can be referenced and utilized to determine the current used to control the motor to operate the sub-panel 110. The look-up table can be referenced and utilized to determine the current used to control the motor to operate the sub-panel 112. The look-up table can be utilized to determine the current used to control the motor to operate the sub-panel 110, based on the torque that would be required to operate the motor used to control the sub-panel 110 to stop and remain stopped. The look-up table can be utilized to determine the current used to control the motor to operate the sub-panel 112, based on the torque that would be required to operate the motor used to control the sub-panel 112 to stop and remain stopped.

At operation 118, the process can include detecting an obstruction of the door, based on a current used by the motor. The current (e.g., actual current) used by the motor to operate the door can be determined by a sensor (e.g., current based sensor). The actual current that is used to operate the motor can be compared to the expected current. The actual current can be similar to, or different from, the expected current. The actual current may be different from the expected current, and outside of a tolerance range, be de determined to be based on an obstruction of the door. In some instances, the actual current can be similar to the expected current, and within the tolerance range, for a portion (e.g., initial portion) of the movement of the door operated by the motor. The actual current can be different from the expected current, and outside of the tolerance range, for a portion (e.g., subsequent portion) of the movement of the door. The subsequent portion can include part of, or all of, a remaining portion of the movement of the door to fully close. The subsequent portion can include part of the remaining portion of the movement of the door to fully close, based on the obstruction being detected and the door not being moved to be fully close. For example, the subsequent portion can include part of the remaining portion of the movement of the door to fully close, based on the obstruction being detected and the door being operated to close.

An example 120 illustrates the door 108 being closed, and an obstruction in the door 108. The actual current used to by the motor to operate the door 108 may be different from the expected current, due to the obstruction. For example, the actual current and the expected current can used by the motor to operate the sub-panel 110. The obstruction can be detected based on determining the actual current exceeds the expected current by a threshold amount. The threshold amount may be set to take into account (i) a dynamic torque and/or (ii) a buffer torque. In some examples, the threshold amount may be on the order of 5-50% above an expected static or dynamic torque (e.g., an amount of the buffer may be 5-50% above the expected static or dynamic torque). In other examples, the threshold amount may be on the order of 5-30% above an expected static or dynamic torque. In still other examples, the threshold amount may be 10-25% above an expected static or dynamic torque. The actual current can be similar to the expected current, and within the tolerance range, for a portion (e.g., initial portion) of the movement of the sub-panel 110 operated by the motor. The initial portion can be associated with movement prior to the sub-panel 110 being obstructed. The actual current can be different from the expected current, and outside of the tolerance range, for a portion (e.g., subsequent portion) of the movement of the sub-panel 110. The subsequent portion can be associated with a moment in time at which the sub-panel 110 is obstructed, based on the sub-panel 110 not being moved to be fully close.

In some examples, an actual current and an expected current can be used by a motor to operate the sub-panel 112. The actual current used to operate the sub-panel 112 can be similar to the expected current, within the tolerance range, based on movement of the sub-panel 112 not being obstructed.

In certain examples, the tolerance range can be associated with a threshold current associated with a baseline current. The baseline current may be a determined current (or current profile) for opening, closing, or otherwise changing a position of a door during baseline conditions. The tolerance range can be adjusted (e.g., +/-0.1%, 1%, 10%, of the expected static or dynamic torque, etc.) to compensate for a current state of the vehicle (e.g., environmental temperature, temperature of a motor or other component, battery charge state, etc.). Thus, if a current temperature exceeds a temperature used for the baseline condition, the threshold can be adjusted by a corresponding amount. This may be a percentage or non-proportional adjustment to the baseline current.

At operation 122, the process can include controlling the motor to operate the door to open. In some examples, the motor can operate the door to move in an opposite direction, based on the obstruction. The motor can change a speed of movement of the door to slow to and stop the door. The motor then can operate the door to move in an opposite direction, based on the door being stopped. The motor can operate the door to open, based on the obstruction being detected and the door being stopped from closing.

An example 124 illustrates the door 108 being operated to open. In some examples, the sub-panel 110 of the door 108 can be operated to stop closing and to open, based on the obstruction. The sub-panel 110 can be slowed and stopped. The sub-panel 110 can be moved in an opposite direction, based on movement of the door being stopped. The motor can operate the sub-panel 110 to open.

In some examples, the motor controlled to operate the sub-panel 110, can be subsequently and/or separately controlled to operate the sub-panel 110 to open or close, or to stop again, based on the obstruction being detected as having been removed. The motor controlled to operate the sub-panel 110, can be subsequently controlled to operate the sub-panel 110 to open, close, or stop, based on another signal received from at least one of the local device, the remote device, or the one or more sensors.

In some examples, the sub-panel 112 can be operated similarly as the sub-panel 110, based on the obstruction being detected and the sub-panel 110 being operated to open. The sub-panel 112 can be operated differently than the sub-panel 110. In some instances, the sub-panel 112 can be operated to continue to close, based on the obstruction being detected and the sub-panel 110 being operated to open. In some instances, the sub-panel 112 can be operated to stop, based on the obstruction being detected and the sub-panel 110 being operated to open.

Although the process above is described with respect to the signal, implementation of the process is not limited as such, and any number of processes can be performed at the same or different times, based on any number of respective signals. For example, another process can be performed in a similar way to operate a door on an opposite side of the vehicle, at a same or different time as the process discussed above.

Although various techniques to operate the door or the sub-panel are described above, implementation of the techniques is not limited as such. In some examples, any of the above techniques can be applied to operate one or more panels (e.g., a door, a sub-panel of the door, a window associated with the door, a window associated with another portion (e.g., a portion of a body), etc.) of the vehicle or a non-vehicle system in a similar way as for the door or the sub-panel. In those examples, the one or more panels can be operated according to the one or more techniques by utilizing any type of mechanism (e.g., a DC brushed motor, an induction motor, a hydraulic system, etc.), similarly as described above for the electric motor.

Therefore, and as described herein, a door of a vehicle can be controlled to change operation based on detecting an obstruction (e.g., a pinch event) associated with the door. An expected current to control the motor to operate the door can be determined based on a look-up table. The expected current can vary based on condition(s), such as a pitch or a roll of the vehicle. The expected current associated with a sub-panel being operated to move in a direction opposite to a component of a force of gravity, can be higher than an expected current associated with a sub-panel being operated to move in the same direction as the component of the force of gravity. An amount of the expected current adjusted based on the force of gravity can be determined based on the look-up table, which includes values of the expected current associated with a torque that would be required to operate the motor used to control the sub-panel to stop and remain stopped. The torque that is used to counteract the component of the force of gravity, can be determined based on a current being sensed by a sensor of the vehicle. In some instances, the expected current associated with a sub-panel being operated to move in a direction of an end of the vehicle that is higher than an opposite end of the vehicle, can be higher than an expected current used to move another sub-panel of the door in the opposite direction.

The obstruction can be detected by monitoring an actual current used by the motor to operate the door. By monitoring the actual current used by the motor, a different between the actual current and the expected current can be determined, based on the obstruction. The difference can occur and be determined, based on the effect of the obstruction on the door and the motor. A change between a difference between the actual current and the expected current that is within a tolerance range during part of operation to open or close the door can be determined with respect to a difference between the actual current and the expected current that is outside of the tolerance range, during another part of the operation to open or close the door. The difference between the actual current and the expected current can be determined to be within the tolerance range, based the door not being obstructed. The difference between the actual current and the expected current can be determined to be outside of the tolerance range, based the door being obstructed. Furthermore, the disclosed techniques can accurately and promptly detect an obstruction of the door based on the current used to control the motor to operate the door even when a small change in current due to the obstructed being associated with a finger is determined. This can be in contrast to a different change in current being determined due to the obstructed being associated with a hand or an arm that may not be detectable otherwise. The current can be changed to control the motor to operate the door to change direction or to stop, based on either the obstruction of the door that is being opened or on the obstruction of the door that is being closed.

In certain examples, a position sensor can be used to determine a position of a door. The position sensor can be a visual sensor (e.g., a camera), an encoder, a variably resistive sensor, etc. A position sensor can be used to compare an anticipated position or speed of a door with an expected position or speed of the door. The position sensor can be used in lieu of or in addition to a current sensor for the door. In certain examples, the position sensor can be used to determine a changed position or speed of a door to associate a current requited to move the door with the change in position or speed. Such information can be used to build look-up tables, as disclosed herein, and/or to supplement additional vehicles conditions (e.g., a voltage from a power supply, a temperature, etc.).

Figure 2:
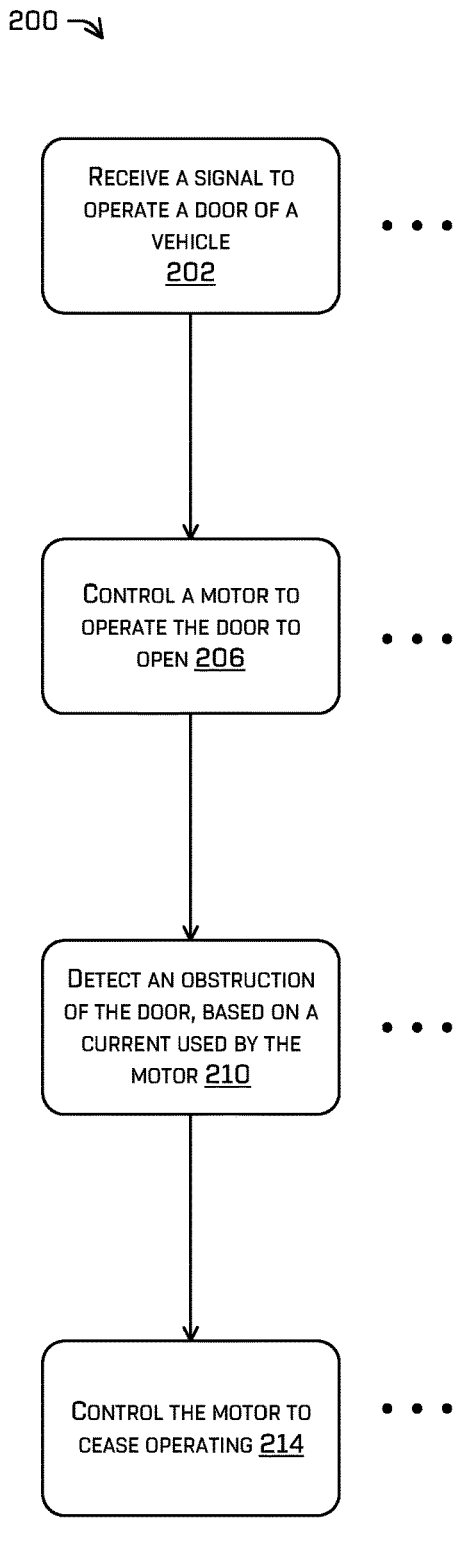
FIG. 2 is a pictorial flow diagram of an example process of controlling a door of a vehicle to open based on a pitch or a roll of the vehicle, in accordance with examples of the disclosure.
Figure 2:
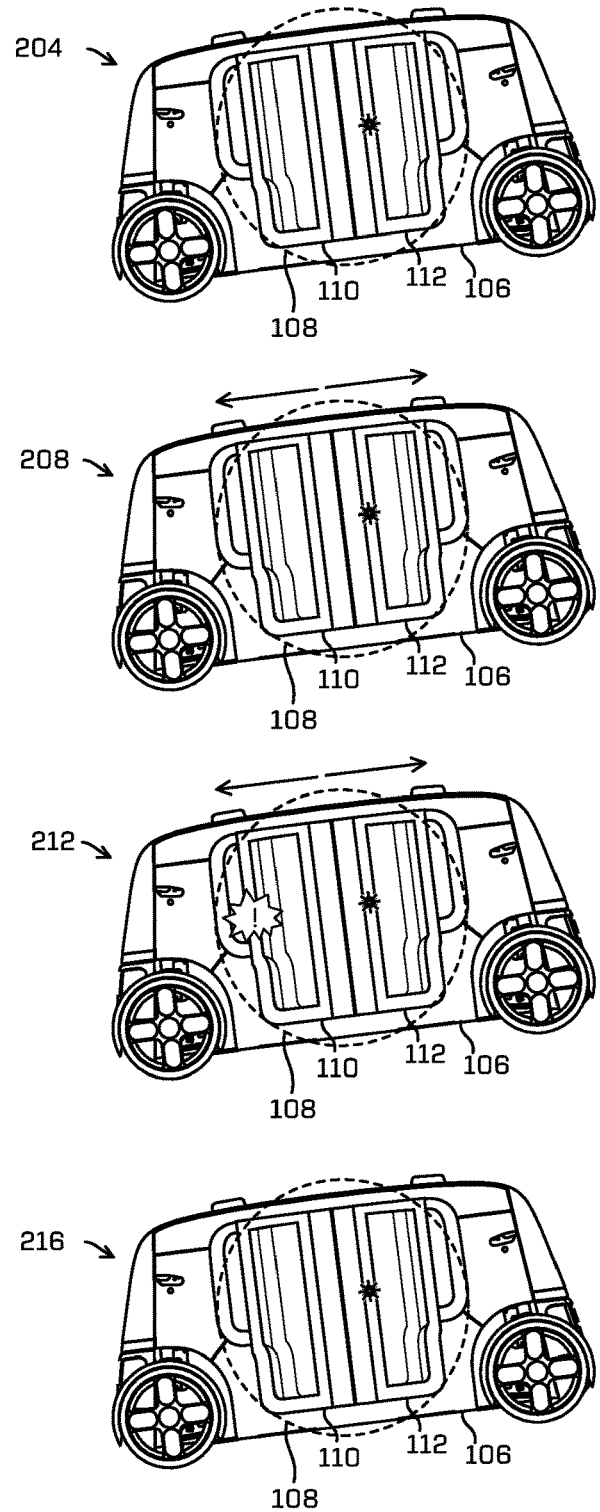

FIG. 2 is a pictorial flow diagram of an example process 200 of controlling a door of a vehicle based on a pitch or a roll of the vehicle, in accordance with examples of the disclosure.

At operation 202, the process can include receiving a signal to operate a door of a vehicle, similarly as discussed above in FIG. 1. However, instead of receiving the signal to operate the door to close, the signal can be received to operate the door to open.

An example 204 illustrates a vehicle 106 that receives a signal to operate a door 108 of the vehicle 106, similarly as discussed above in FIG. 1. However, instead of the vehicle 106 receiving the signal to operate the door to close, the vehicle 106 can receive the signal to operate the door to open.

At operation 206, the process can include controlling a motor to operate the door, similarly as discussed above in FIG. 1. However, instead of controlling the motor to operate the door to close, the motor can be controlled to operate the door to open.

An example 208 illustrates the vehicle 106 that includes a motor being controlled to operate the door 108, similarly as discussed above in FIG. 1. However, instead of the motor of the vehicle 106 being controlled to operate the sub-panel 110 to close, the motor of the vehicle 106 can be controlled to operate the sub-panel 110 to open. The sub-panel 112 can be operated to open similarly as for the sub-panel 110.

At operation 210, the process can include detecting an obstruction (e.g., a blocking event) of the door, based on a current used by the motor, similarly as discussed above in FIG. 1. However, instead of detecting the obstruction of the door, based on the current used by the motor to close the door, the obstruction of the door can be detected, based on the current used by the motor to open the door. The obstruction can be detected based on determining the actual current exceeds the expected current by a threshold amount. The threshold amount may be set to take into account (i) a dynamic torque and (ii) a buffer. As discussed above, the threshold may be on the order of 5-50% above a current associated with an expected static or a dynamic torque (e.g., an amount of the buffer may be 5-50% above a current associated with the expected static or the dynamic torque). In other examples, the threshold amount may be on the order of 5-30%, 10-25%, or other suitable range above a current associated with an expected static or dynamic torque.

An example 212 illustrates the vehicle 106 that includes the door 108 (e.g., sub-panel 110) being obstructed, an obstruction of the sub-panel 110 being detected based on a current used by the motor, similarly as discussed above in FIG. 1. However, instead of the obstruction of the sub-panel 110 being detected based on a current used by the motor to operate the sub-panel 110 to close, the obstruction of the sub-panel 110 is detected based on a current used by the motor to operate the sub-panel 110 to open.

At operation 214, the process can include controlling a motor to cease operating. In some examples, the motor can operate the door to stop opening, based on the obstruction. The motor can be controlled to not move the door. In some examples, the current can be cut off from the motor. Alternatively, a current can be used by the motor to hold the door stationary, by counteracting a component of force due to gravity.

An example 216 illustrates the vehicle 106, which includes a motor being controlled to cease operating the door 108. In some examples, the sub-panel 110 of the door 108 can be operated to stop opening and to remain stationary, based on the obstruction. The sub-panel 110 can be stopped, by being slowed to a stopped position. The motor can operate the sub-panel 110 to open.

In some examples, the motor controlled to operate the sub-panel 110, can be subsequently and/or separately controlled to operate the sub-panel 110 to open or close or to remain stopped, based on the obstruction being detected as having been removed. The motor controlled to operate the sub-panel 110, can be subsequently controlled to operate the sub-panel 110 to open, close, or stop, based on another signal received from at least one of the local device, the remote device, or the one or more sensors.

In some examples, a motor controlled to operate a door on an opposite side of the vehicle 106, and/or the motor controlled to operate the sub-panel 112 can be controlled similarly as for the motor controlled to operate the sub-panel 110. In some examples, the motor controlled to operate the sub-panel 112 can cease, based on the obstruction being detected and the motor being controlled to cease operating the sub-panel 110 to close. The sub-panel 112 can be operated differently than the sub-panel 110. In some examples, the sub-panel 112 can be operated to stop, based on the obstruction being detected and the sub-panel 110 being operated to stop. In some examples, the motor controlled to operate the sub-panel 112, can be controlled to operate the sub-panel 112 to continue opening or to close, based on the obstruction being detected and the sub-panel 110 being operated to stop.

Although various techniques to operate the door or the sub-panel are described above, implementation of the techniques is not limited as such. In some examples, any of the above techniques can be applied to operate one or more panels of the vehicle or a non-vehicle system in a similar way as for the door or the door panel. In those examples, the one or more panels can be operated according to the one or more techniques by utilizing any type of mechanism (e.g., a DC brushed motor, an induction motor, a hydraulic system, etc.), similarly as described above for the electric motor.

Therefore, and as described herein, the vehicle can include the motor being controlled to operate the door to open, based on an obstruction (e.g., a blocking event). The motor can be controlled to operate the door based on determining a change in the current associated with the obstruction. However, instead of controlling the motor to operate the door in a reverse direction, the motor controlling the door to open can be controlled to cease operating, based on the obstruction. By controlling the motor to cease operating, the door can be operated to not injure an object (e.g., a person) obstructing the door. By controlling the motor to cease operating instead of to operate in a reverse direction, the door can avoid injuring the object (e.g., the person) associated with the obstruction, while also avoiding injury to another person entering or exiting the vehicle through the door.

Figure 3:
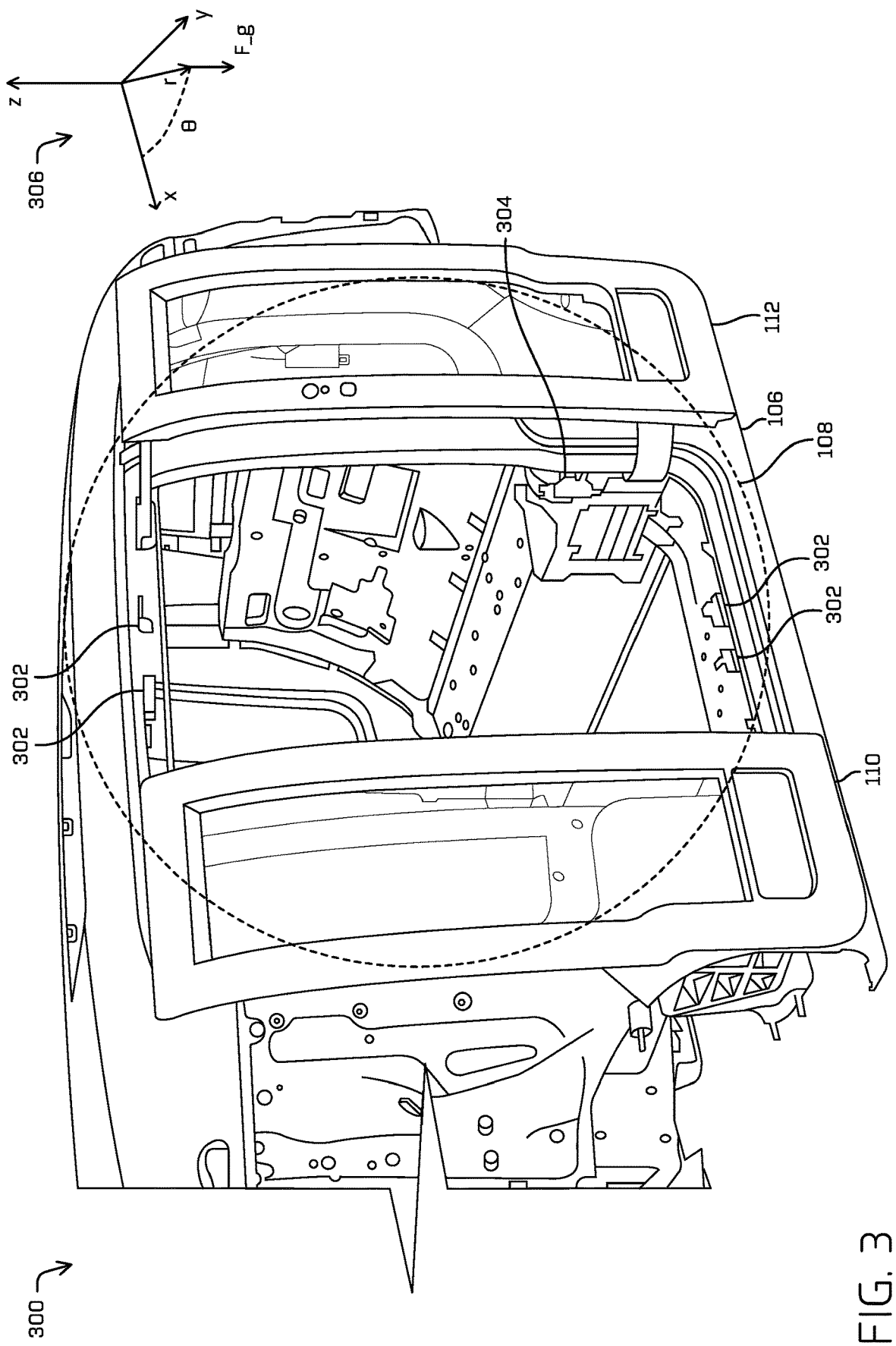
FIG. 3 is a perspective view of an example vehicle including latches and a primary drive unit device associated with a door, in accordance with examples of the disclosure.

FIG. 3 is a perspective view 300 of an example vehicle including latches and a primary drive unit device associated with a door, in accordance with examples of the disclosure.

As illustrated in FIG. 3, a vehicle 106 can include one or more latches (e.g., latch 302) and a primary drive unit device 304 associated with a door 108.

In some examples, the latches 302 can include two latches at a bottom portion (e.g., floor) of the vehicle 106, two latches at a top portion (e.g., ceiling) of the vehicle 106, and two latches at a middle portion (e.g., side) of vehicle 106. Each of the latch(es) 302 can attach to the door 108, based on the door 108 being closed. In some examples, one of the latches 302 at the top portion of the vehicle 106, one of the latches 302 at the bottom portion of the vehicle 106, and one of the latches 302 at the side portion of the vehicle 106 can each attach to a portion of the sub-panel 110, based on the sub-panel 110 being closed. In some examples, one of the latches 302 at the top portion of the vehicle 106, one of the latches 302 at the bottom portion of the vehicle 106, and one of the latches 302 at the side portion of the vehicle 106 can each attach to a portion of the sub-panel 112, based on the sub-panel 112 being closed. The latches 302 can hold in place either or both of the sub-panel 110 and the sub-panel 112, based on the latches 302 being attached to the respective sub-panel when it is closed. The latches 302 can release either or both of the sub-panel 110 and the sub-panel 112, based on the latches 302 being controlled to open and detach from the respective sub-panel when it is controlled by the motor to open.

The vehicle 106 can include a primary drive unit 304 at a bottom of the door 108. The primary drive unit 304 can be utilized to operate the door 108. The vehicle 106 can include any number of primary drive units utilized to operate respective doors. Each of the primary drive units can be used to control current to one or more motors. Each of the motors can be controlled to operate one or more sub-panels. In some examples, each of the sub-panel 110 and the sub-panel 112 can be operated by one of the motors. The vehicle 106 can include any number of motors to operate respective sub-panels.

An amount of a pitch (e.g., a pitch in an x direction) can be greater or less than zero and associated with a first longitudinal end portion of the vehicle 106 being lower or higher than a second longitudinal end portion of the vehicle 106. An amount of a roll (e.g., a roll associated with a y direction) can be greater or less than zero and associated with a left portion of the vehicle 106 being lower or higher than a right portion of the vehicle 106.

In some examples, a torque can be determined based on a static freebody analysis 306. In the static freebody analysis 306, a gravity vector $\vec{F}_g$ can be determined according to an equation 1, shown below:

$$\vec{F}_g = F_{gx}\hat{x} + F_{gy}\hat{y} + F_{gz}\hat{z}, \tag{1}$$

where $F_{gx}\hat{x}$ is a force due to gravity in a first direction (e.g., an x direction), $F_{gy}\hat{y}$, is a force due to gravity in a second direction (e.g., a y direction), and $F_{gz}\hat{z}$, is a force due to gravity in a third direction (e.g., a z direction).

A door point mass vector r associated with a position of a door can be determined according to an equation 2, shown below:

$$\vec{r} = |r_x|\cos(\theta)\hat{x} + |r_x|\cos(\theta)\hat{y}, \tag{2}$$

where $|r_x|\cos(\theta)\hat{x}$ is a first component of the door point mass vector $\vec{r}$, and $|r_x|\cos(\theta)\hat{x}$ is a second component of the door point mass vector.

The torque τ caused by gravity can be determined according to an equation 3, shown below:

$$\vec{\tau} = \vec{r} \times \vec{F}_g. \tag{3}$$

Figure 4:
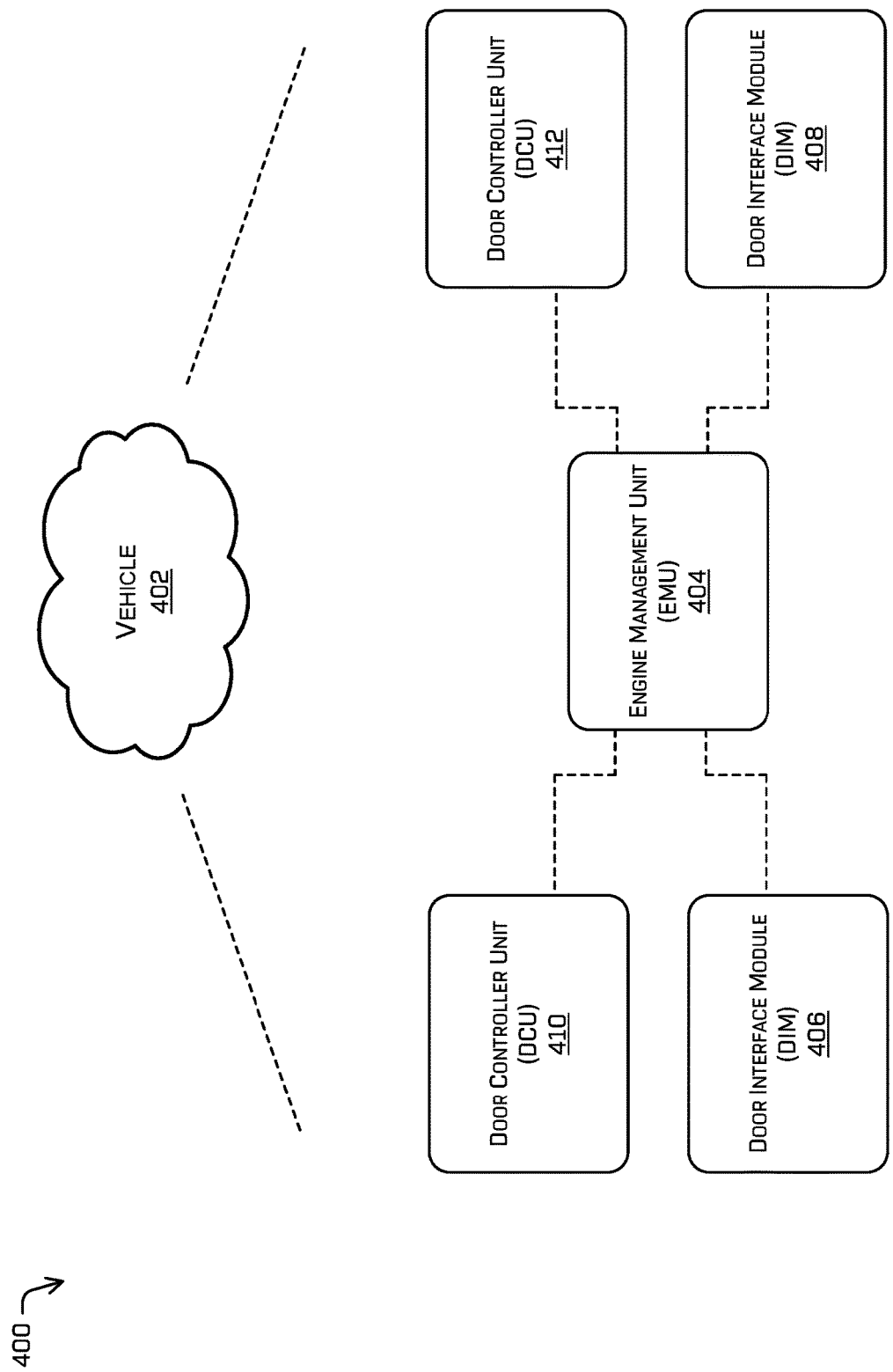
FIG. 4 is a block diagram of an example system for implementing the techniques described herein.

FIG. 4 is a block diagram of an example system 400 for implementing the techniques described herein.

As illustrated in FIG. 4, the example system 400 can be incorporated in a vehicle 402. In the example illustrated in FIG. 4, the vehicle 402 can be utilized to implement the vehicle 106 to perform any of the processes, as described above in FIG. 1 and FIG. 2.

In some examples, the vehicle 402 can include an engine management unit (EMU) 404, one or more door interface module (DIM) components (e.g., DIM 406 and DIM 408), and/or one or more door controller unit (DCU) components (e.g., DCU 410 and DCU 412).

The EMU 404 can include, or be separate from, one or more primary drive units (e.g., primary drive unit 304), each of the one or more primary drive units being utilized to operate a door of the vehicle. The EMU 404 can control, via the primary drive unit 304, one or more motors to operate the door 108. In some instances, the EMU 404 can be utilized to control a motor to operate the sub-panel 110 and a motor to operate the sub-panel 112. In some instances, the EMU 404 can be utilized to control the motor to operate the sub-panel 110, via the DIM 406); and the EMU 404 can be utilized to control the motor to operate the sub-panel 112, via the DIM 408. The DIM 406 can transmit, based on a signal transmitted by the EMU 404, a signal to an actuating system associated with the sub-panel 110 to operate the sub-panel 110. The DIM 408 can transmit, based on a signal transmitted by the EMU 404, a signal to an actuating system associated with the sub-panel 110 to operate the sub-panel 112.

In some examples, the EMU 404 can receive one or more signals and control, via the respective primary drive units, each of the doors, according to any of the processes discussed above in FIG. 1 and FIG. 2. The EMU 404 can be utilized to control each of motors associated with a sub-panel (e.g., sub-panel 110 or sub-panel 112). Each of motors can be controlled by based on an expected current associated with one or more conditions (e.g., a pose, a temperature, a voltage, and/or a historical current) determined to affect a force required to operate one or more doors and/or one or more of the sub-panels of the vehicle 106. The EMU 404 can be utilized to determine a difference between the expected current and an actual current used by the motor to operate the sub-panel. The EMU 404 can be utilized determine an obstruction of the sub-panel, based on the difference between the expected current and the actual current. In some examples, the EMU 404 can be utilized determine, via a DCU (e.g., the DCU 410), the actual current used to control the motor to operate the sub-panel 110; and the EMU 404 can be utilized determine, via a DCU (e.g., the DCU 412), the actual current used to control the motor to operate the sub-panel 112.

By way of example, the EMU 404 can be used to control the current to one or more motors, based on the actual current being determined by a current based sensor. In some examples, additional anti-pinch sensors such as a door strip (e.g., pressure sensor, touch sensor, etc.) and/or a light curtain can additionally or alternatively be used to determine an obstruction (a pinch event and/or a blocking event) of a door.

In some examples, the DCU 410 can control the sub-panel 110. The signal received by the actuating system to operate the sub-panel 110 can be output by a DIM (e.g., the DIM 406) based on the signal being initiated the DCU 410, instead of being based on a signal received from the EMU 404. Alternatively, the DCU 410 can receive and route the signal from the EMU 404 to the DIM 406, which then sends to signal to the actuating system to operate the sub-panel 110. The DCU 412 can control the sub-panel 112. The signal received by the actuating system to operate the sub-panel 112 can be output by a DIM (e.g., the DIM 408) based on a signal initiated and sent from the DCU 412, instead of a signal from the EMU 404. Alternatively, the DCU 412 can receive and route the signal from the EMU 404 to the DIM 408, which then sends to signal to the actuating system to operate the sub-panel 112.

Figure 5:
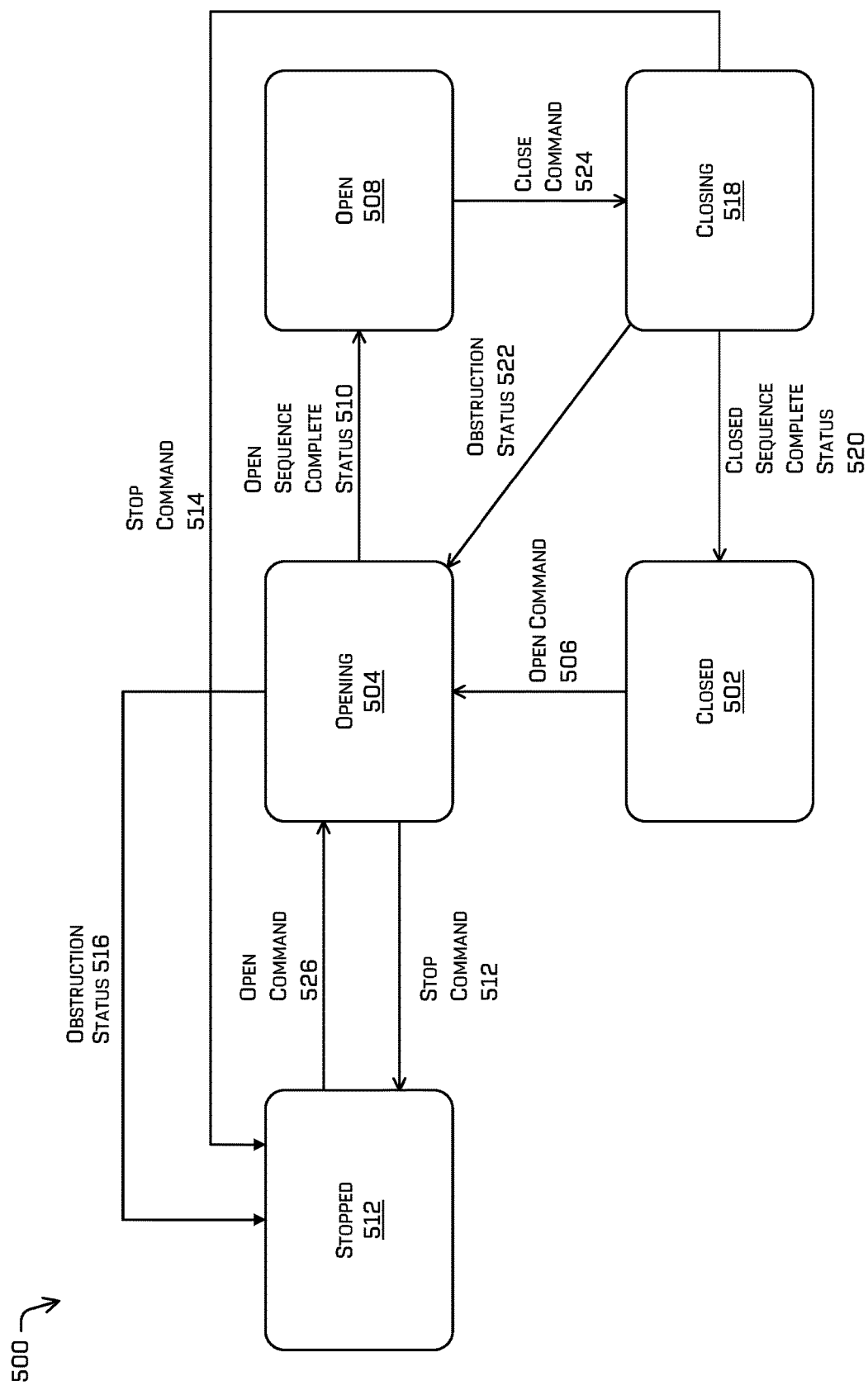
FIG. 5 is a flowchart depicting an example door control operation based on a detected pose of the vehicle.

FIG. 5 is a flowchart depicting an example door control operation based on a detected pose of the vehicle. As illustrated in FIG. 5, the example system 500 can be implemented by any of the engine management unit (EMU) 404, the one or more door interface module (DIM) components (e.g., DIM 406 and DIM 408), and/or the one or more door controller unit (DCU) components (e.g., DCU 410 and DCU 412), or any combination thereof, as discussed above in FIG. 4.

In some examples, the phases of the examples system 500 can be associated with any door and/or sub-panel of the vehicle (e.g., vehicle 106). Each door and/or sub-panel can be individually controlled based on the phases of the example system 500. In some examples, the phases of the examples system 500 can be collectively associated with one or more doors of the vehicle. Although discussed below with respect to a door (e.g., door 108) of the vehicle, any panel, combination of panels, door, combination of doors, sub-panel, or combination of sub-panels of the vehicle can be operated in a similar way.

In some examples, a motor can be used to control a door of a vehicle based on various phases stored in the EMU 404 and/or the DCU 410. The phases of the motor can be set based on a command associated with a signal received, as discussed above in any of FIG. 1 and FIG. 2. The motor used to operate the door can be controlled based on a phase being set as a closed phase 502. The phase of the motor that is set as the closed phase 502 can be associated with six latches (e.g., latches 302) being locked (e.g., attached to the door) to secure any door to the vehicle. The phase set as the closed phase 502 can be an initial phase used to control the motor.

The motor used to operate the door can be controlled based on the phase being set as an opening phase 504. The phase of the motor can be changed from the closed phase 502 to the opening phase 504, based on an open command 506 associated with a signal being received to operate the door to open, as discussed above in FIG. 2. One or more of the latches can be unlocked (e.g., detached from the door) based on the phase set as the opening phase 504. The door of the vehicle can be controlled to begin opening and continue to open until fully opened, based on the phase set as the opening phase 504.

The motor used to operate the door can be controlled based on the phase being set as an open phase 508. The phase of the motor can be changed from the opening phase 504 to the open phase 508, based on determining an open sequence complete status 510. The open sequence complete status 510 can be associated with the door of the vehicle being fully open.

The motor used to operate the door can be controlled based on the phase being set as a stopped phase 512. The phase of the motor can be changed from the opening phase 504 to the stopped phase 512, based on determining a stop commend 514 associated with a signal being received to operate the door to stop. In some instances, the door of the vehicle can be closed, with no latches locked (e.g., attached to the door), or with one or more latches (e.g., one-six latches) locked, based on the phase being set as the stopped phase 512. In some examples, the signal to operate the door to stop can be received similarly as for the signal that is received as discussed above in any of FIG. 1 and FIG. 2. The phase of the motor can be changed from the opening phase 504 to the stopped phase 512, based on determining an obstruction status 516. The obstruction status 516 can be associated with one or more conditions (e.g., a pose, a temperature, a voltage, and/or a historical current) determined to affect a force required to operate one or more doors and/or one or more of the sub-panels of the vehicle. For example, the obstruction status 516 can be a pinch detection status. The condition status 516 can be determined based on the actual current of one sub-panel (e.g., sub-panel 110) and/or another sub-panel (e.g., sub-panel 112) being operated to open is different from the expected current, and outside of the tolerance range, for a portion (e.g., subsequent portion) of the movement, as discussed above in FIG. 2. The door 108 can be controlled to stop based on the phase set as the stopped phase 512.

The motor used to operate the door can be controlled based on the phase being set as a closing phase 518. The phase of the motor can be changed from the open phase 508 to the closing phase 518, based on a close command 524 associated with a signal being received to operate the door to close, as discussed above in FIG. 1. The door can be controlled to begin closing and continue to close until fully closed, based on the phase set as the closing phase 518.

The motor used to operate the door can be changed from the closing phase 518 to the closed phase 502, based on determining a closed sequence complete status 520. The open sequence complete status 520 can be associated with the door being fully closed.

The motor used to operate the door can be changed from the closing phase 518 to the opening phase 504, based on determining an obstruction status 522. The obstruction status 522 can be associated with one or more conditions (e.g., a pose, a temperature, a voltage, and/or a historical current) determined to affect a force required to operate one or more doors and/or one or more of the sub-panels of the vehicle. For example, the obstruction status 522 can be a pinch detection status. The obstruction status 522 can be determined based on the actual current of a sub-panel and/or another sub-panel being operated to close is different from the expected current, and outside of the tolerance range, for a portion (e.g., subsequent portion) of the movement, as discussed above in FIG. 1

The motor used to operate the door can be changed from the open phase 508 to the closing phase 518, based on a close command 524 associated with a signal being received to operate the door 108 to close, as discussed above in FIG. 1. The door can be controlled to begin closing and continue to close until fully closed, based on the phase set as the closing phase 518.

The motor used to operate the door can be changed from the closing phase 518 to the stopped phase 512, based on determining the stop commend 514 associated with the signal being received to operate the door to stop. The door can be controlled to stop based on the phase set as the stopped phase 512.

The motor used to operate the door can be changed from the stopped phase 512 to the opening phase 504, based on an open command 526 associated with a signal being received to operate the door to open, as discussed above in FIG. 2. The door can be controlled to begin the opening phase and continue to open until fully opened, based on the phase set as the opening phase 504.

Figure 6A:
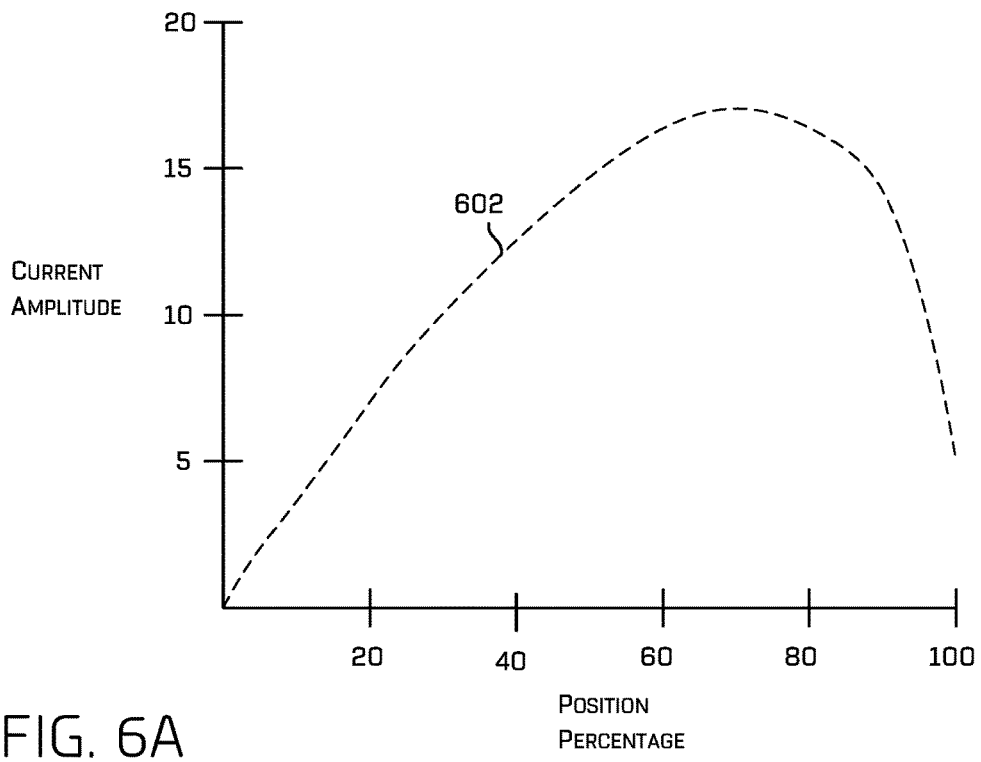
FIGS. 6A and 6B are illustrations of example graphs depicting currents associated with controlling a motor to operate a door of the vehicle along a path when the vehicle is at a particular pose. The relationship of current to position for the particular pose may be stored (e.g., in a look-up table) and used to determine an expected current for the motor, in accordance with examples of the disclosure.
Figure 6B:
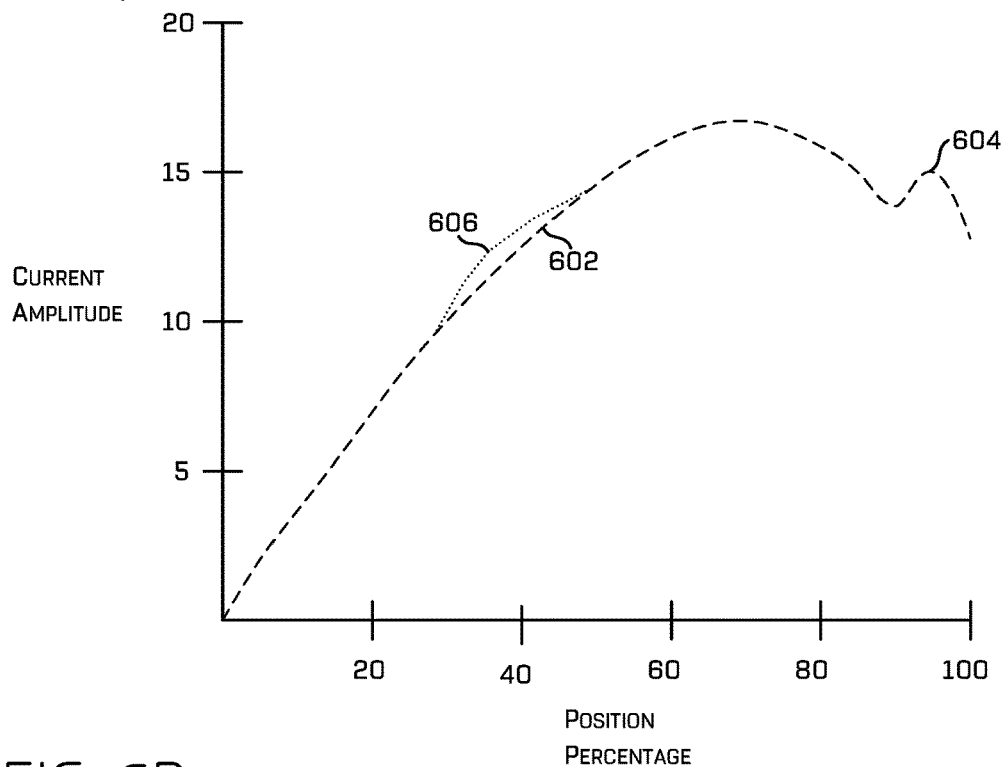

FIGS. 6A and 6B are illustrations of example graphs 600A and 600B depicting currents associated with controlling a motor to operate a door of the vehicle along a path when the vehicle is at a particular pose. The relationship of current to position for the particular pose may be stored (e.g., in a look-up table) and used to determine an expected current for the motor, in accordance with examples of the disclosure.

As illustrated in FIG. 6A, a current 602 can be associated with a motor controlled to operate a door, sub-panel, or group of doors (e.g., double doors driven by a single motor) of vehicle along a path for a particular condition or set of conditions (e.g., pose, roll, pitch, temperature, voltage, historical current, etc.). The graph 600A illustrates that the current 602 used by the motor varies along the path of the door operation (from open to closed or vice versa). While only one graph is shown, in practice a separate graph may be generated for each panel, door, sub-panel, or group of panels for each unique set of conditions.

The horizontal axis of the graph 600A represents a position of the door along its path (e.g., a percentage of the distance along the length of the path), while the vertical axis of the graph 600A represents a load on the motor (e.g., a current drawn by the motor). While the graph 600A is illustrated in terms of current on the vertical axis, in some examples, the vertical axis may represent torque rather than current.

In some examples, the relationships represented by the graph(s) may be computed in advance (e.g., on the bench for an entire fleet of vehicles, on a particular vehicle when/ before it is put into service, on a particular vehicle periodically during used, or at any other time) and stored in a look-up table or other data structure and used by the vehicle to determine the expected current for a given door at each point along the path of the door. The expected currents for a motor for a given position of the door along its path can be obtained from the graph or a look-up table corresponding to the current set of conditions. In certain examples, an expected current can be determined in real time via the use of a position sensor for a corresponding door. For example, an expected current to close or open a door can change over time due to degradation or wear of components (e.g., a power supply, a track, or an electric motor). A position sensor (e.g., a camera, encoder, etc.) can be used to record a required current to more a door. This can be accomplished via a calibration routine. A calibration routine can be initiated at a time or location where no obstructions with a door are expected (e.g., at initial startup and/or before, during, or after charging). The expected currents recorded in real time can be associated with an environmental (e.g., temperature, humidity, etc.) or other characteristic as disclosed herein. Through these techniques, an expected current can be updated over time to close, open, or otherwise change the position of a door.

Each of the expected currents associated with motors used to operate doors, sub-panels, or groups of doors of the vehicle can be controlled based on values in the look-up table or other data structures. For example, each of the expected currents can be controlled based on the current 602. The values in the look-up table can be associated with characteristics of the motors of the vehicle. In some instances, a characteristic can include an expected torque that a motor would require to operate a sub-panel to stop and remain stopped. The expected torque that the motor would require to operate the sub-panel to stop and remain stopped can be determined based on a pitch and/or a roll of the vehicle. Expected torques can be determined based on multiple different unique sets of conditions (e.g., tens, hundreds, or thousands of different combinations of conditions). Additionally or alternatively, the expected torque can be determined based on an amount of a current that is required to apply the torque to maintain a stopped position of the sub-panel, and/or based on manufacturer and/or supplier specifications of the motor, and/or the current being empirically measured for each individual motor before, during, or after it is put into service.

The look-up table can include expected torques associated with the vehicle, based on the periodic maintenance of the vehicle. In some instances, the look-up table can include additional parameters (e.g., parameters used to adjust the expected torques to be higher or lower) associated with the expected torques that are determined based on the periodic maintenance of the vehicle. The additional parameters can be stored in addition to or instead of initial expected torques associated with the vehicle based on the vehicle being first put into service. The additional parameters can be utilized to account for changes to the initial expected torques based on wear and tear on the motor, hinges, door tracks, door seals, linkages, or other components of the door operation system.

In some examples, the values stored in the look-up table or other data structure can include attributes associated with the motors. The attributes can include a life span of a door, a life span of a sub-panel, a life span of a motor, and/or a date of a last maintenance performed on the vehicle and/or the motors. The attributes can be considered in determining the expected torque, to detect obstructions (e.g., pinches) with greater accuracy.

In some examples, the values stored in the look-up table can include factors, such as a historical current used by the motor to operate the door, a voltage applied to the motor, and/or a temperature (e.g., ambient temperature and/or temperate of the motor). Historical currents can be determined based on currents being measured by one or more sensors (e.g., current sensors) of the vehicle. A historical current can be a measured current used by a motor to perform an operation (e.g., open or close). A historical current can be recorded and used to adjust an amount of current required to operate the motor in the future (e.g., when conditions are similar to when the historical current was sensed). In this manner, a current profile for an operation and/or for a configuration of a door system can be built over time through operation of the door. In certain examples, when a historic current can be used to determine an expected current to open or close a door free from obstruction and/or when a certain obstruction is detected. For example, a system can be provided feedback via a camera and/or user of the vehicle as to whether an obstruction was not detected and a door continued with its operation. In such a scenario, the historic current can be used to update a future threshold for detecting an obstruction and/or for a fleet of vehicle (by crowd sharing such information). As should be understood, an expected current for a door and/or associated conditions for an expected current can be crowd shared between vehicles. In certain embodiments, an expected current can be associated with a door operation by a vehicle at a location (e.g., on a map) that can be shared with other vehicles that may later by at the location and operate a door. Each of the sensors can sense a current, the current being associated with a torque applied to a door, sub-panel, or group of doors. For example, each of the sensors can sense the current 602. The voltage and/or the temperature can be associated with the motor and stored along with the expected torque in the look-up table. By determining and storing the voltage and/or the temperature in the look-up table, the voltage and/or the temperature, along with the expected torque, can be used for temperature compensation for the torque output by the motor.

In some instances, the torque output of the motor can be determined along with the current used by the motor. By way of example, current drawn by the motor can be used as a proxy as a measure of the torque output by the motor. In other examples, the torque output by the motor and the current used by the motor can be determined differently, to account for different voltages and/or temperatures associated with the motor. By taking the different voltages and/or temperatures stored in the look-up table into account, the torque output by the motor can be determined based on a measurement of the current used by the motor. For example, the torque output can be determined based on the measurement of the current used by the motor, to compensate for different operating temperatures of the motor.

In some examples, individual look-up tables can be associated with each vehicle (e.g., values associated with motors in a vehicle can be include). Such a look-up table can be determined on a per-vehicle basis. In some examples, a look-up table can be associated with each fleet of vehicles or each model of vehicle. Such a look-up table can be determined on a per-fleet or per-model basis.

The torque output by the motor can be determined by precomputation, based on the values in the look up table. The torque output by the motor can be computed in real time compensation, based on varying temperature associated with the motor. Values (e.g., expected torques, additional parameters, factors, etc.) in the look-up table can be determined and updated in real time. By updating the look-up table in real time, attributes for the expected torques can be updated based on temperature, wear and tear on the motors and other system components, or other conditions.

In some examples, end of line current measurement data associated with a motor and/or a supplier can be used to determine the expected torque stored in the look-up table. The end of line current measurement data can be stored in a log. In some instances, the end of line current measurement data can be accessed via a quick response (QR) code positioned on the motor. The end of line current measurement data can be accessed via the QR code and used during a manufacturing process of the vehicle. The QR code can be scanned and the end of line current measurement data can be used to determine a parameter specific to a motor, such as a current output for the motor at a torque (e.g., a motor can be determined to output 20 newton-meters at 5 amps, another motor can be determined to output 20 newton-meters, at 5.5 amps, etc.). The parameter specific to a motor can be used to determine the torque output by the motor. By using the parameter specific to the motor to determine the torque output by the motor, variation associated in torque output by different motors can be accounted for. By way of example, a general supplier specification for all motors associated with a supplier can be used to determine the torques output by the motors. In other examples, a specification for each individual motor can be used, the specification including a torque curve for the motor to be installed on the vehicle. The specifications for each motor can be used to determine the torque output by the motor for a given current.

In some examples, an expected torque can be determined based on an amount of torque required to open and/or close the door being considered to be constant over a whole range of motion associated with a door. The expected torque can be determined as a fixed number determined based on experimentation. In some examples, an expected torque (e.g., expected dynamic torque) can be determined based on an amount of torque required to open and/or close the door being considered to be not constant over the whole range of motion.

In certain examples, an expected electrical current can be non-linear and/or discontinuous depending on a position of a door (even after accounting for accelerating or deceleration door movements). For example, a track for a door may have an imperfection which may create a relatively higher friction area along the track as opposed to others. In certain examples, the door design itself may operate by opening or closing with a variable expected current along the operation due to, for example, bump stops, latches, and other features of the door system. In other words, an expected current to open or close a door may be non-linear and/or discontinuous along a path of movement of the door. FIG. 6B illustrates an example graph 600B which includes a bump stop or latch at the end of the door travel. When the door reaches the bump stop or latch, the current needed to secure the door against the bump stop or latch increases. Thus, the graph 600B shows a second peak or local maximum in the current, as shown at 604, corresponding to the position of the bump stop or latch along the door path. The information associated with graph 600B, including the non-linearity or discontinuity can be stored in a lookup table or other data structure associated with the particular door or other panel. In addition to or instead of accounting for the increase in current associated with the bump stop or latch in the graph of expected current, the door system may account for this non-linearity or discontinuity by adjusting the threshold above which an obstruction will be detected. For instance, the door system may increase the buffer or threshold above the expected current associated with an expected static or dynamic torque for the portion of the door path having the bump stop, latch, or other feature of the track that requires additional force. In that case, the buffer or threshold may be increased by a set amount (e.g., 1 amp, 2 amps, 5 amps, etc.), a percentage (e.g., 10%, 20%, 50%), or the threshold may be set to infinite over the relevant portion of the door path.

In certain examples, an expected current may be dynamically adjusted during operation of a vehicle to mitigate false positive obstruction detection. For example, a door may be commanded to close and may detect an obstruction one or more times (e.g., after three attempts) at a certain location along the door's trajectory. For example, the door mechanism may detect an obstruction halfway through the door's closing trajectory. Such an obstruction may be caused by a newly compromised component of the door system (e.g., a piece of gum or a bent rail). In such a condition, a lack of an obstruction may optionally be verified by an occupant of a vehicle (via a graphical or audible user interface, for example) or by a camera system of the vehicle. If it is verified that there is no obstruction, the expected current may be increased to allow for a greater force to be applied for closing the door. For example, the expected current can be increased based on a greater current 606 being needed at a moment in time than the current 602, to allow for the greater force.

Figure 7:
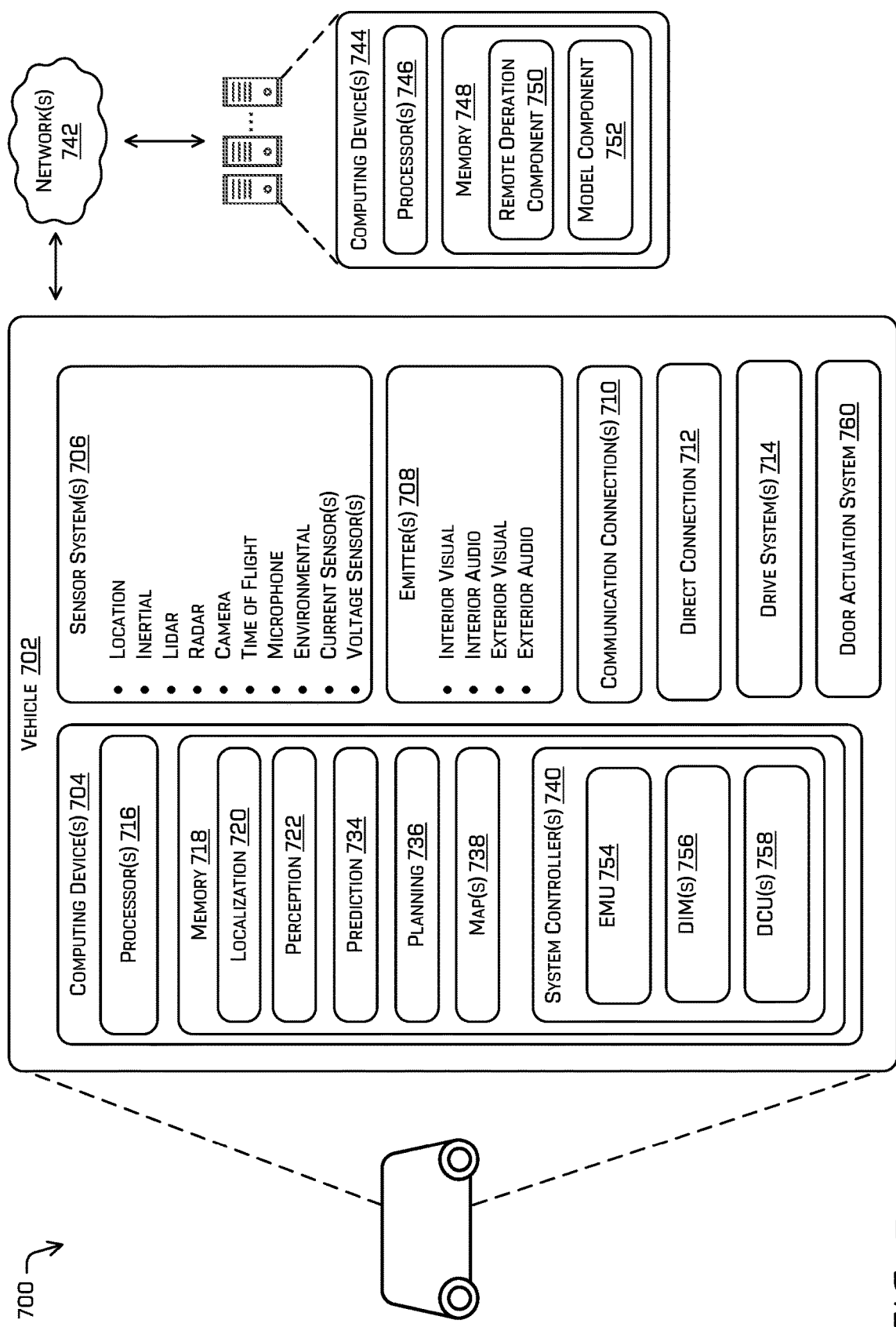
FIG. 7 is a block diagram of an example system for implementing the techniques described herein, in accordance with examples of the disclosure.

FIG. 7 is a block diagram of an example system 700 for implementing the techniques described herein, in accordance with examples of the disclosure. In at least one example, the system 700 can include a vehicle 702.

The vehicle 702 can be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 702 can be configured to control all functions from start to completion of the trip, including all parking functions, it can not include a driver and/or controls for driving the vehicle 702, such as a steering wheel, an acceleration pedal, and/or a brake pedal. This is merely an example, and the systems and methods described herein can be incorporated into any ground-borne, airborne, or water-borne vehicle, including those ranging from vehicles that need to be manually controlled by a driver at all times, to those that are partially or fully autonomously controlled.

The vehicle 702 can include one or more computing device(s) 704, one or more sensor system(s) 706, one or more emitter(s) 708, one or more communication connection(s) 710 (also referred to as communication devices and/or modems), at least one direct connection 712 (e.g., for physically coupling with the vehicle 702 to exchange data and/or to provide power), one or more drive system(s) 714, and a door actuation system 760. The one or more sensor system(s) 706 can be configured to capture sensor data associated with an environment.

The one or more sensor system(s) 706 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, current sensors, voltage sensors, etc. The one or more sensor system(s) 706 can include multiple instances of each of these or other types of sensors. For instance, the time-of-flight sensors can include individual time-of-flight sensors located at the corners, the first longitudinal end, the second longitudinal end, sides, and/or top of the vehicle 702. As another example, the camera sensors can include multiple cameras disposed at various locations about the exterior and/or interior of the vehicle 702. The one or more sensor system(s) 706 can provide input to the computing device 704. One or more of the current sensor can be utilized to sense a current (e.g., determine an amount of the current) associated with a motor utilized to operate one or more doors and/or sub-panels. One or more of the voltage sensors can be utilized to sense a voltage (e.g., determine an amount of the voltage) associated with a motor utilized to operate one or more doors and/or sub-panels, The vehicle 702 can also include one or more emitter(s) 708 for emitting light and/or sound. The one or more emitter(s) 708 in this example include interior audio and visual emitters to communicate with passengers of the vehicle 702. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 708 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which can comprise acoustic beam steering technology.

The vehicle 702 can also include one or more communication connection(s) 710 that enable communication between the vehicle 702 and one or more other local or remote computing device(s) (e.g., a remote teleoperation computing device) or remote services. For instance, the one or more communication connection(s) 710 can facilitate communication with other local computing device(s) on the vehicle 702, the one or more drive system(s) 714 and/or the door actuation system 760. Also, the one or more communication connection(s) 710 can allow the vehicle 702 to communicate with other nearby computing device(s) (e.g., other nearby vehicles, traffic signals, etc.).

The one or more communications connection(s) 710 can include physical and/or logical interfaces for connecting the computing device 704 to another computing device or one or more external networks 742 (e.g., the Internet). For example, the one or more communications connection(s) 710 can enable Wi-Fi-based communication such as via frequencies defined by the IEEE 802.11 standards, short range wireless frequencies such as Bluetooth, cellular communication (e.g., 2G, 3G, 4G, 4G LTE, 7G, etc.), satellite communication, dedicated short-range communications (DSRC), or any suitable wired or wireless communications protocol that enables the respective computing device to interface with the other computing device(s).

In at least one example, the vehicle 702 can include one or more drive system(s) 714. In some examples, the vehicle 702 can have a single drive system 714. In at least one example, if the vehicle 702 has multiple drive systems 714, individual drive systems 714 can be positioned on opposite ends of the vehicle 702 (e.g., the first longitudinal end and the second longitudinal end, etc.). In at least one example, the drive system(s) 714 can include one or more sensor system(s) 706 to detect conditions of the drive system(s) 714 and/or the surroundings of the vehicle 702. By way of example and not limitation, the sensor system(s) 706 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 714. In some cases, the sensor system(s) 706 on the drive system(s) 714 can overlap or supplement corresponding systems of the vehicle 702 (e.g., sensor system(s) 706).

The drive system(s) 714 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 714 can include a drive system controller which can receive and preprocess data from the sensor system(s) 706 and to control operation of the various vehicle systems. In some examples, the drive system controller can include one or more processor(s) and memory communicatively coupled with the one or more processor(s). The memory can store one or more components to perform various functionalities of the drive system(s) 714. Furthermore, the drive system(s) 714 also include one or more communication connection(s) that enable communication by the respective drive system with one or more other local or remote computing device(s).

The door actuation system 760 can be utilized to control one or more components (e.g., motor(s), linkage(s), hinge(s), linkage(s), door seal(s), or the like) associated with one or more doors and/or done or more sub-panels of the vehicle. In some examples, the door actuation system 760 may control a motor to be actuated to operate to open or close a door or a sub-panel. The door actuation system 760 may interact with any other components (e.g., an EMU, a DIM, a DCU, etc.) to operate the door.

The computing device(s) 704 can include one or more processor(s) 716 and memory 718 communicatively coupled with the one or more processor(s) 716. In the illustrated example, the memory 718 of the computing device 704 stores a localization component 720, a perception component 722, a prediction component 734, a planning component 736, a maps component 738, and one or more system controller(s) 740, each of the system controller(s) 740 comprising an engine management unit (EMU) component 754, a door interface module (DIM) component 756, and/or a door controller unit (DCU) component 758. Though depicted as residing in the memory 718 for illustrative purposes, it is contemplated that the localization component 720, the perception component 722, the EMU component 754, the DIM component 756, and/or the DCU component 758, the prediction component 734, the planning component 736, the maps component 738, and the one or more system controller(s) 740 can additionally, or alternatively, be accessible to the computing device 704 (e.g., stored in a different component of vehicle 702) and/or be accessible to the vehicle 702 (e.g., stored remotely).

In memory 718 of the computing device 704, the localization component 720 can include functionality to receive data from the sensor system(s) 706 to determine a position of the vehicle 702. For example, the localization component 720 can include and/or request/receive a three-dimensional map of an environment and can continuously determine a location of the vehicle within the map. In some instances, the localization component 720 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the vehicle. In some instances, the localization component 720 can provide data to various components of the vehicle 702 to determine an initial position of a vehicle for generating a trajectory, as discussed herein.

The perception component 722 can include functionality to perform object detection, segmentation, and/or classification. In some examples, the perception component 722 can provide processed sensor data that indicates a presence of an entity that is proximate to the vehicle 702 and/or a classification of the entity as an entity type (e.g., car, pedestrian, cyclist, building, tree, road surface, curb, sidewalk, unknown, etc.). In additional and/or alternative examples, the perception component 722 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

As described above, the perception component 722 can use perception algorithms to determine a perception-based bounding box associated with an object in the environment based on sensor data. For example, the perception component 722 can receive image data and classify the image data to determine that an object is represented in the image data. Then, using detection algorithms, the perception component 722 can generate a two-dimensional bounding box and/or a perception-based three-dimensional bounding box associated with the object. The perception component 722 can further generate a three-dimensional bounding box associated with the object. As discussed above, the three-dimensional bounding box can provide additional information such as a location, orientation, pose, and/or size (e.g., size, width, height, etc.) associated with the object.

The perception component 722 can include functionality to store perception data generated by the perception component 722. In some instances, the perception component 722 can determine a track corresponding to an object that has been classified as an object type. For purposes of illustration only, the perception component 722, using sensor system(s) 706 can capture one or more images of an environment. The sensor system(s) 706 can capture images of an environment that includes an object, such as a pedestrian. The pedestrian can be at a first position at a time T and at a second position at time T+t (e.g., movement during a span of time t after time T). In other words, the pedestrian can move during this time span from the first position to the second position. Such movement can, for example, be logged as stored perception data associated with the object.

The stored perception data can, in some examples, include fused perception data captured by the vehicle. Fused perception data can include a fusion or other combination of sensor data from sensor system(s) 706, such as image sensors, lidar sensors, radar sensors, time-of-flight sensors, sonar sensors, global positioning system sensors, internal sensors, and/or any combination of these. The stored perception data can additionally or alternatively include classification data including semantic classifications of objects (e.g., pedestrians, vehicles, buildings, road surfaces, etc.) represented in the sensor data. The stored perception data can additionally or alternatively include track data (positions, orientations, sensor features, etc.) corresponding to motion of objects classified as dynamic objects through the environment. The track data can include multiple tracks of multiple different objects over time. This track data can be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The prediction component 734 can generate one or more probability maps representing prediction probabilities of possible locations of one or more objects in an environment. For example, the prediction component 734 can generate one or more probability maps for vehicles, pedestrians, animals, and the like within a threshold distance from the vehicle 702. In some instances, the prediction component 734 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

The planning component 736 can determine a path for the vehicle 702 to follow to traverse through an environment. For example, the planning component 736 can determine various routes and paths and various levels of detail. In some instances, the planning component 736 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 736 can generate an instruction for guiding the vehicle along at least a portion of the route from the first location to the second location. In at least one example, the planning component 736 can determine how to guide the vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level can be selected to operate the vehicle.

In other examples, the planning component 736 can alternatively, or additionally, use data from the perception component 722 and/or the prediction component 734 to determine a path for the vehicle 702 to follow to traverse through an environment. For example, the planning component 736 can receive data from the perception component 722 and/or the prediction component 734 regarding objects associated with an environment. Using this data, the planning component 736 can determine a route to travel from a first location (e.g., a current location) to a second location (e.g., a target location) to avoid objects in an environment. In at least some examples, such a planning component 736 can determine there is no such collision free path and, in turn, provide a path which brings vehicle 702 to a safe stop avoiding all collisions and/or otherwise mitigating damage.

The memory 718 can further include one or more maps 738 that can be used by the vehicle 702 to navigate within the environment. For the purpose of this discussion, a map can be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map can include, but is not limited to: covariance data (e.g., represented in a multi-resolution voxel space), texture information (e.g., color information (e.g., RGB color information, Lab color information, HSV/HSL color information), and the like), intensity information (e.g., LIDAR information, RADAR information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map can include a three-dimensional mesh of the environment. In some instances, the map can be stored in a tiled format, such that individual tiles of the map represent a discrete portion of an environment, and can be loaded into working memory as needed, as discussed herein. In at least one example, the one or more maps 738 can include at least one map (e.g., images and/or a mesh). In some examples, the vehicle 702 can be controlled based at least in part on the map(s) 738. That is, the map(s) 738 can be used in connection with the localization component 720, the perception component 722 (and sub-components), the prediction component 734, and/or the planning component 736 to determine a location of the vehicle 702, identify objects in an environment, generate prediction probabilit(ies) associated with objects and/or the vehicle 702, and/or generate routes and/or trajectories to navigate within an environment.

In at least one example, the computing device 704 can include one or more system controller(s) 740, which can be configured to control steering, propulsion, braking, safety, emitters, communication, and other systems of the vehicle 702. These system controller(s) 740 can communicate with and/or control corresponding systems of the drive system(s) 714 and/or other components of the vehicle 702, which can be configured to operate in accordance with a path provided from the planning component 736.

The vehicle 702 can connect to computing device(s) 744 via network 742 and can include one or more processor(s) 746 and memory 748 communicatively coupled with the one or more processor(s) 746. In at least one instance, the one or more processor(s) 746 can be similar to the processor(s) 716 and the memory 748 can be similar to the memory 718. In the illustrated example, the memory 748 of the computing device(s) 744 stores a remote operation component 750 and/or a model component 752. In at least one instance, the model component 752, after empirical testing and/or simulations, can generate ML models to be used by the perception component 722, as discussed herein. Though depicted as residing in the memory 748 for illustrative purposes, it is contemplated that the remote operation component 750 and the model component 752 can additionally, or alternatively, be accessible to the computing device(s) 744 (e.g., stored in a different component of computing device(s) 744 and/or be accessible to the computing device(s) 744 (e.g., stored remotely).

The model component 752 can include functionality to generate models for determining heights/classifications of multi-channel image data, as discussed herein.

The EMU component 754 can include functionality to control one or more motors to operate the door. In some instances, the EMU component 754 can include functionality to control, via a primary drive unit, the one or more motors. The EMU component 754 can be utilized to implement an EMU (e.g., EMU 404) of the vehicle, as described above in FIG. 4.

The DIM component 756 can include functionality to determine and transmit a signal to an actuating system associated with the sub-panel to operate the sub-panel. In some instances, the DIM component 756 can transmit, based on a signal transmitted by the EMU component 754, the signal to the actuating system associated with the sub-panel to operate the sub-panel. The DIM component 756 can be utilized to implement one or more DIM components (e.g., (e.g., DIM 406 and/or DIM 408)) of the vehicle, as described above in FIG. 4.

The DCU component 758 can include functionality to control the sub-panel. The signal received by the actuating system to operate the sub-panel can be output by the DIM component 756 based on the signal being initiated by the DCU component 758, instead of being based on a signal received from the EMU component 754. Alternatively, the DCU component 758 can receive and route the signal from the EMU component 754 to the DIM component 756, which then sends to signal to the actuating system to operate the sub-panel. The DCU component 758 can be utilized to implement one or more DCU components (e.g., (e.g., DCU 410 and/or DCU 412) of the vehicle, as described above in FIG. 4.

The processor(s) 716 of the computing device 704 and the processor(s) 746 of the computing device(s) 744 can be any suitable processor capable of executing instructions to process data and perform operations as described herein. By way of example and not limitation, the processor(s) 716 and 746 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 718 computing device 704 and the memory 748 of the computing device(s) 744 are examples of non-transitory computer-readable media. The memory 718 and 748 can store an operating system and one or more software applications, instructions, programs, and/or data to implement the methods described herein and the functions attributed to the various systems. In various implementations, the memory 718 and 748 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine-learning algorithms. For example, in some instances, the components in the memory 718 and 748 can be implemented as a neural network.

As described herein, an exemplary neural network is a biologically inspired algorithm which passes input data through a series of connected layers to produce an output. Each layer in a neural network can also comprise another neural network, or can comprise any number of layers (whether convolutional or not). As can be understood in the context of this disclosure, a neural network can utilize machine learning, which can refer to a broad class of such algorithms in which an output is generated based on learned parameters.

Although discussed in the context of neural networks, any type of machine learning can be used consistent with this disclosure. For example, machine learning or machine-learned algorithms can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc.

Figure 8:
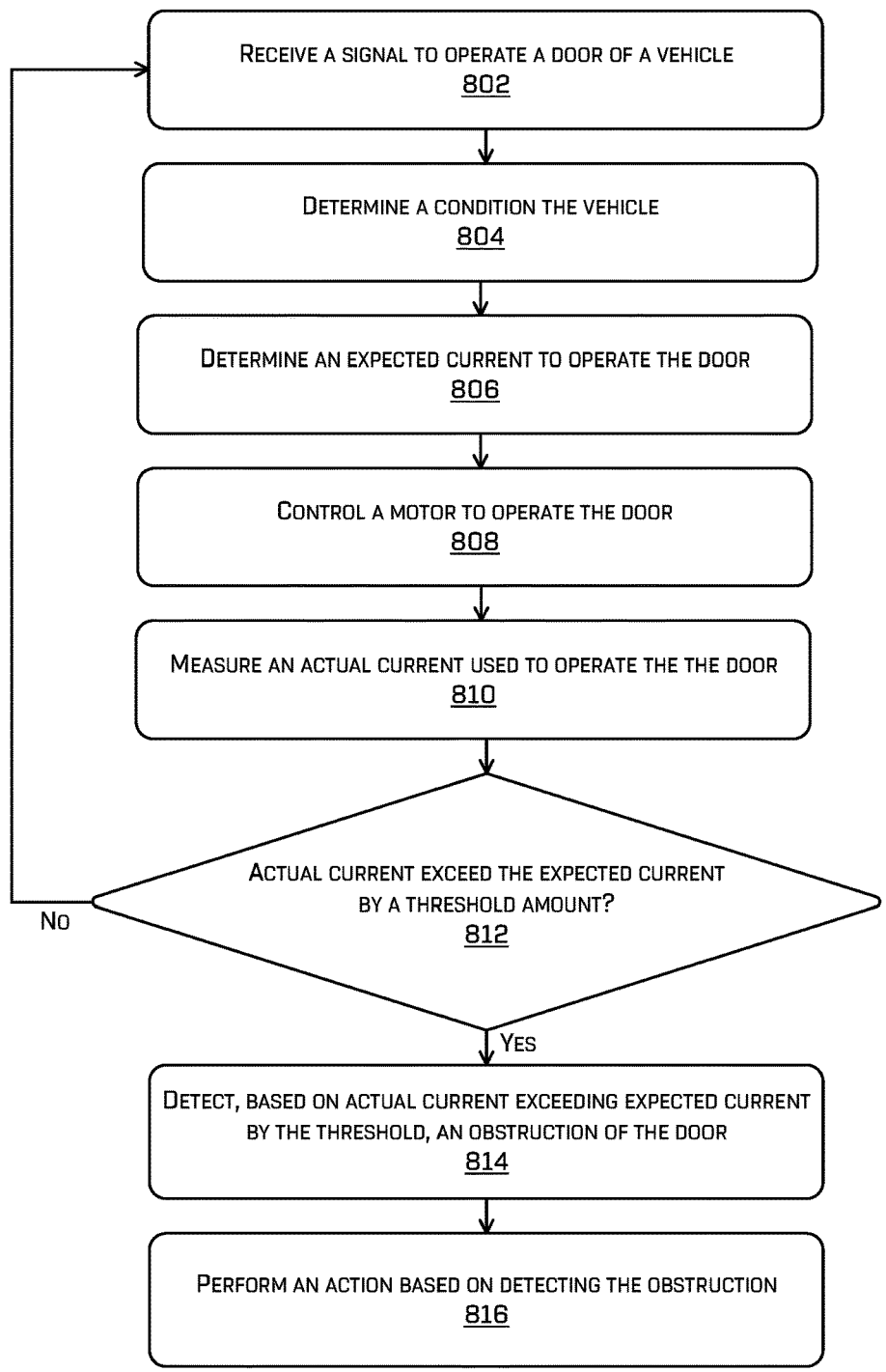
FIG. 8 is a flowchart depicting an example process for controlling a door of a vehicle based on a pitch or a roll of the vehicle, in accordance with examples of the disclosure.

FIG. 8 is a flowchart depicting an example process for controlling a door of a vehicle based on a pitch or a roll of the vehicle, in accordance with examples of the disclosure. For example, some or all of the process 800 can be performed by one or more components in FIG. 4, as described herein At operation 802, the process can include receiving a signal to operate a door of a vehicle. The signal can be used operate a door of the vehicle. In some instances, the signal can be used to independently operate a sub-panel of the door. In some instances, the signal can be used to operate, together, two sub-panels of the vehicle.

At operation 804, the process can include determining a condition (e.g., a pitch or a roll) of the vehicle. An amount of the pitch and/or a roll the vehicle can be greater or less than zero.

At operation 806, the process can include determining an expected current to operate the door. The expected current can be determined based on a look-up table. The look-up table can include values of currents associated with values of torques torque that would be required to operate the motor used to control the sub-panel to stop and remain stopped. The look-up table can be referenced (e.g., searched and/or queried) to determine the expected current used to control the motor. The look-up table can be utilized to determine the expected current, based on the torque that would be required to operate the motor used to control the sub-panels to stop and remain stopped.

At operation 808, the process can include controlling a motor to operate the door. The motor can be controlled to operate the door based on the expected current, which can be determined based on the pitch and/or the roll of the vehicle. The door can include one or more sub-panels that are operated based on the expected current.

At operation 810, the process can include measuring an actual current used by the motor to operate the door. The actual current used by the motor to operate the door can be determined by a sensor (e.g., current based sensor). The current can be determined directly or indirectly. For example, a magnetic flux or a voltage applied to a portion of a motor can be used to infer a current applied to the motor.

At operation 812, the process can include determining whether the actual current exceeds the expected current by a threshold amount. In certain embodiments, a threshold amount from an expected current can be determined based on historic values or a features between historic values. For example, a greater variation between historical values (and/or crowd sourced values) can be used to provider a greater margin for the threshold before an action is triggered. Conversely, if historic values (and/or crowd sourced values) are relatively consistent, the threshold may be minimized. The actual current that is used to operate the motor can be compared to the expected current. The actual current may be similar to, or different from, the expected current. The actual current can be different from the expected current, and outside of a tolerance range, based on an obstruction of the door. In some instances, the actual current can be similar to the expected current, and within the tolerance range, for a portion (e.g., initial portion) of the movement of the door operated by the motor. The actual current can be different from the expected current, and outside of the tolerance range, for a portion (e.g., subsequent portion) of the movement of the door. The actual current can be different from the expected current, and outside of the tolerance range, for a portion (e.g., subsequent portion) of the movement of the door. The subsequent portion can be associated with the obstruction being detected.

At operation 814, the process can include detecting, based on the actual current exceeding the expected current by the threshold, an obstruction of the door. For example, the obstruction being detected may correspond to a pinch event in which an object (e.g., person, appendage, bag, etc.) is preventing the door from closing. In another example, the obstruction may correspond to a blocking event in which an object (e.g., person, appendage, bag, etc.) is preventing the door from opening.

At operation 816, the process can include performing an action based on detecting the obstruction. In some instances, the motor can change a speed of movement of the door to slow to and stop the door. The motor then can operate the door to move in an opposite direction, based on the door being stopped. The motor can operate the door to open, based on the obstruction being detected and the door being stopped from closing.

In some instances, the motor controlled to operate the door to open can cease. The motor controlled to operate the door to open can cease, based on the obstruction being detected.

Therefore, and as described herein, a door of a vehicle can be controlled to change operation based on detecting an obstruction associated with the door. An amount of the expected current can be determined based on a look-up table, which includes values of the expected current associated with a torque that would be required to operate the motor used to control the sub-panel to stop and remain stopped. A difference between an actual current and the expected current that is within a tolerance range during part of operation to open or close the door can be determined with respect to a difference between the actual current and the expected current that is outside of the tolerance range, during another part of the operation to open or close the door. The difference between the actual current and the expected current can be determined to be within the tolerance range, based the door not being obstructed. The difference between the actual current and the expected current can be determined to be outside of the tolerance range, based the door being obstructed. The door can be controlled based on the difference between the actual current and the expected current, to avoid injury/damage to persons and/or objects obstructing the door.

Example Clauses

A: A vehicle comprising: one or more processors; and one or more computer-readable media storing instructions executable by the one or more processors, wherein the instructions, when executed, cause the system to perform operations comprising: receiving a signal to operate a door of the vehicle to open or close; determining at least one of a pitch or a roll of the vehicle: determining, based at least in part on the at least one of the pitch or the roll, an expected current to operate the door; controlling a motor to operate the door: measuring an actual current used by the motor to operate the door: determining that the actual current exceeds the expected current by a threshold amount: detecting, based at least in part on the actual current exceeding the expected current by the threshold, an obstruction of the door preventing the door from opening or closing; and performing an action based at least in part on detecting the obstruction.

B: The vehicle of paragraph A, wherein the action comprises at least one of: controlling the motor to cease operating the door: or controlling the motor to operate the door in an opposite direction.

C: The vehicle of paragraph A or B, wherein: the door comprises a first sub-panel and a second sub-panel, the motor is operably coupled to the first sub-panel, a second motor is operably coupled to the second sub-panel, and the operations further comprise: determining, based at least in part on the at least one of the pitch or the roll, a second expected current to operate the second sub-panel, the second expected current being different than the expected current: measuring a second actual current used by the second motor to operate the second sub-panel; and determining that the second actual current exceeds the second expected current by a second threshold amount, wherein detecting the obstruction is further based at least in part on the second actual current exceeding the second expected current by the second threshold amount.

D: The vehicle of any of paragraphs A-C, wherein the door comprises a first door disposed on a first lateral side of the vehicle, and the vehicle comprises a second door disposed on a second lateral side of the vehicle opposite the first lateral side, the operations further comprising: determining, based at least in part on the signal, which door to operate from among the first door and the second door, wherein determining the expected current to operate the door is further based at least in part on which of the first door or the second door is to be operated.

E: The vehicle of any of paragraphs A-D, wherein determining the expected current is further based at least in part on at least one of: a temperature: a voltage applied to the motor: or a historical current used by the motor to operate the door.

F: A method comprising: receiving a signal to operate a door of a vehicle; determining a physical state associated with the vehicle: determining, based at least in part on the physical state, an expected current to operate the door: controlling a motor to operate the door: determining an actual current used by the motor to operate the door; determining that the actual current exceeds the expected current by a threshold amount; detecting, based at least in part on the actual current exceeding the expected current by the threshold, an obstruction of the door; and performing an action based at least in part on detecting the obstruction.

G: The method of paragraph F, wherein determining the physical state comprises determining at least one of a pitch or a roll of the vehicle.

H: The method of paragraph F or G, wherein determining the expected current to operate the door is further based on: determining the door to open from among multiple doors of the vehicle; and determining a lateral side of the vehicle on which the door is located.

I: The method of any of paragraphs F-H, wherein: the vehicle is part of a fleet of vehicles; and determining the expected current is further based at least in part on one or more expected currents associated with one or more other vehicles in the fleet of vehicles.

J: The method of any of paragraphs F-I, wherein the signal indicates to operate the door to close, and the action comprises controlling the motor to operate the door to open.

K: The method of any of paragraphs F-J, wherein: determining the physical state comprises determining a pitch and a roll of the vehicle, the door comprises a first sub-panel and a second sub-panel, the motor is operably coupled to the first sub-panel, a second motor is operably coupled to the second sub-panel, and the method further comprise: determining, based at least in part on the at least one of the pitch or the roll, a second expected current to operate the second sub-panel, the second expected current being different than the expected current: determining a second actual current used by the second motor to operate the second sub-panel; and determining that the second actual current exceeds the second expected current by a second threshold amount, wherein detecting the obstruction is further based at least in part on the second actual current exceeding the second expected current by the second threshold amount.

L: The method of any of paragraphs F-K, wherein the door comprises a first door disposed on a first lateral side of the vehicle, and the vehicle comprises a second door disposed on a second lateral side of the vehicle opposite the first lateral side, the method further comprising: determining, based at least in part on the signal, which door to operate from among the first door and the second door, wherein determining the expected current to operate the door is further based at least in part on which of the first door or the second door is to be operated.

M: The method of any of paragraphs F-L, wherein the expected current is further based at least in part on at least one of: a temperature: a voltage applied to the motor: or a historical current used by the motor to operate the door.

N: The method of any of paragraphs F-M, wherein: the door comprises a first sub-panel and a second sub-panel: the motor is operably coupled to the first sub-panel and the second sub-panel via a linkage such that the motor is operable to control both the first sub-panel and the second sub-panel: determining the expected current is based at least in part on operating the first sub-panel and the second sub-panel; and detecting the obstruction comprises detecting the obstruction with at least one of the first sub-panel or the second sub-panel.

O: One or more non-transitory computer-readable media storing instructions that, when executed, cause one or more processors to perform operations comprising: receiving a signal to operate a panel of a vehicle: determining a physical state associated with the vehicle: determining, based at least in part on the physical state, an expected current to operate the panel: controlling a motor to operate the panel: determining an actual current used by the motor to operate the panel: determining that the actual current exceeds the expected current by a threshold amount; and detecting, based at least in part on the actual current exceeding the expected current by the threshold, an obstruction of the panel; and performing an action based at least in part on detecting the obstruction.

P: The one or more non-transitory computer-readable media of paragraph O, wherein determining the physical state comprises determining at least one of a pitch or a roll of the vehicle.

Q: The one or more non-transitory computer-readable media of paragraph O or P, wherein determining the expected current to operate the panel is further based on: determining the panel to open from among multiple panels of the vehicle; and determining a lateral side of the vehicle on which the panel is located.

R: The one or more non-transitory computer-readable media of any of paragraphs O-Q, wherein the signal indicates to operate the panel to open, and the action comprises controlling the motor to cease operating the panel.

S: The one or more non-transitory computer-readable media of any of paragraphs O-R, wherein the signal indicates to operate the panel to close, and the action comprises controlling the motor to operate the panel to open.

T: The one or more non-transitory computer-readable media of any of paragraphs O-S, wherein the panel is a first panel disposed on a first lateral side of the vehicle, and the vehicle comprises a second panel disposed on a second lateral side of the vehicle opposite the first lateral side, the operations further comprising: determining, based at least in part on the signal, which panel to operate from among the first panel and the second panel, wherein determining the expected current to operate the panel is further based at least in part on which of the first panel or the second panel is to be operated.

While the example clauses described above are described with respect to one particular implementation, it should be understood that, in the context of this document, the content of the example clauses can also be implemented via a method, device, system, computer-readable medium, and/or another implementation.

Additionally, any of examples A-T can be implemented alone or in combination with any other one or more of the examples A-T.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A vehicle comprising:
    one or more processors; and
    one or more computer-readable media storing instructions executable by the one or more processors, wherein the instructions, when executed, cause the vehicle to perform operations comprising:
    receiving a signal to operate a door of the vehicle to open or close;
    determining a pitch and a roll of the vehicle;
    determining a historical current changing over time and being previously used by a motor to operate the door of the vehicle with a previous pitch and a previous roll;
    determining, based at least in part on the historical current, and the pitch and the roll, an expected current to operate the door;
    controlling the motor to operate the door;
    measuring an actual current used by the motor to operate the door;
    determining that the actual current exceeds the expected current by a threshold amount;
    detecting, based at least in part on the actual current exceeding the expected current by the threshold amount, an obstruction of the door preventing the door from opening or closing; and
    performing an action based at least in part on detecting the obstruction.

2. The vehicle of claim 1, wherein the action comprises at least one of:
    controlling the motor to cease operating the door; or
    controlling the motor to operate the door in an opposite direction.

3. The vehicle of claim 1, wherein:
    the door comprises a first sub-panel and a second sub-panel,
    the motor is operably coupled to the first sub-panel,
    a second motor is operably coupled to the second sub-panel, and
    the operations further comprise:
    determining, based at least in part on the at least one of the pitch or the roll, a second expected current to operate the second sub-panel, the second expected current being different than the expected current;
    measuring a second actual current used by the second motor to operate the second sub-panel; and
    determining that the second actual current exceeds the second expected current by a second threshold amount,
    wherein detecting the obstruction is further based at least in part on the second actual current exceeding the second expected current by the second threshold amount.

4. The vehicle of claim 1, wherein the door comprises a first door disposed on a first lateral side of the vehicle, and the vehicle comprises a second door disposed on a second lateral side of the vehicle opposite the first lateral side, the operations further comprising:
    determining, based at least in part on the signal, which door to operate from among the first door and the second door,
    wherein determining the expected current to operate the door is further based at least in part on which of the first door or the second door is to be operated.

5. The vehicle of claim 1, wherein determining the expected current is further based at least in part on at least one of:
    a temperature; or
    a voltage applied to the motor.

6. A method comprising:
    receiving a signal to operate a door of a vehicle;
    determining a physical state associated with the vehicle;
    determining a historical current changing over time and being previously used by a motor to operate the door of the vehicle with a previous pitch and a previous roll;
    determining, based at least in part on the historical current, and the physical state, an expected current to operate the door;
    controlling the motor to operate the door;
    determining an actual current used by the motor to operate the door;
    determining that the actual current exceeds the expected current by a threshold amount;
    detecting, based at least in part on the actual current exceeding the expected current by the threshold amount, an obstruction of the door; and
    performing an action based at least in part on detecting the obstruction.

7. The method of claim 6, wherein determining the physical state comprises determining pitch and a roll of the vehicle.

8. The method of claim 6, wherein determining the expected current to operate the door is further based on:
   determining the door to open from among multiple doors of the vehicle; and
   determining a lateral side of the vehicle on which the door is located.

9. The method of claim 6, wherein:
   the vehicle is part of a fleet of vehicles; and
   determining the expected current is further based at least in part on one or more expected currents associated with one or more other vehicles in the fleet of vehicles.

10. The method of claim 6, wherein the signal indicates to operate the door to close, and the action comprises controlling the motor to operate the door to open.

11. The vehicle of claim 1, the operations further comprising:
   determining a second historical current crowd shared between a fleet of vehicles, the second historical current being associated with operation of another door of another vehicle previously at a location of the vehicle,
   wherein determining the expected current further comprises determining the expected current based at least in part on the second historical current.

12. The method of claim 6, wherein the door comprises a first door disposed on a first lateral side of the vehicle, and the vehicle comprises a second door disposed on a second lateral side of the vehicle opposite the first lateral side, the method further comprising:
   determining, based at least in part on the signal, which door to operate from among the first door and the second door,
   wherein determining the expected current to operate the door is further based at least in part on which of the first door or the second door is to be operated.

13. The method of claim 6, wherein the expected current is further based at least in part on at least one of:
   a temperature.

14. The method of claim 6, wherein:
   the door comprises a first sub-panel and a second sub-panel;
   the motor is operably coupled to the first sub-panel and the second sub-panel via a linkage such that the motor is operable to control both the first sub-panel and the second sub-panel;
   determining the expected current is based at least in part on operating the first sub-panel and the second sub-panel; and
   detecting the obstruction comprises detecting the obstruction with at least one of the first sub-panel or the second sub-panel.

15. One or more non-transitory computer-readable media storing instructions that, when executed, cause one or more processors to perform operations comprising:
   receiving a signal to operate a panel of a vehicle;
   determining a physical state associated with the vehicle;
   determining a historical current changing over time and being previously used by a motor to operate the panel of the vehicle with previous pitch and a previous roll;
   determining, based at least in part on the historical current, and the physical state, an expected current to operate the panel;
   controlling the motor to operate the panel;
   determining an actual current used by the motor to operate the panel;
   determining that the actual current exceeds the expected current by a threshold amount; and
   detecting, based at least in part on the actual current exceeding the expected current by the threshold amount, an obstruction of the panel; and
   performing an action based at least in part on detecting the obstruction.

16. The one or more non-transitory computer-readable media of claim 15, wherein determining the physical state comprises determining a pitch and a roll of the vehicle.

17. The one or more non-transitory computer-readable media of claim 15, wherein determining the expected current to operate the panel is further based on:
   determining the panel to open from among multiple panels of the vehicle; and
   determining a lateral side of the vehicle on which the panel is located.

18. The one or more non-transitory computer-readable media of claim 15, wherein the signal indicates to operate the panel to open, and the action comprises controlling the motor to cease operating the panel.

19. The one or more non-transitory computer-readable media of claim 15, wherein the signal indicates to operate the panel to close, and the action comprises controlling the motor to operate the panel to open.

20. The one or more non-transitory computer-readable media of claim 15, wherein the panel is a first panel disposed on a first lateral side of the vehicle, and the vehicle comprises a second panel disposed on a second lateral side of the vehicle opposite the first lateral side, the operations further comprising:
   determining, based at least in part on the signal, which panel to operate from among the first panel and the second panel,
   wherein determining the expected current to operate the panel is further based at least in part on which of the first panel or the second panel is to be operated.

* * * * *